United States Patent
Eichelberger et al.

(10) Patent No.: US 7,112,467 B2
(45) Date of Patent: Sep. 26, 2006

(54) STRUCTURE AND METHOD FOR TEMPORARILY HOLDING INTEGRATED CIRCUIT CHIPS IN ACCURATE ALIGNMENT

(75) Inventors: Charles W. Eichelberger, Reading, MA (US); Paul V. Starenas, Windham, NH (US)

(73) Assignee: EPIC Technologies, Inc., Woburn, MA (US)

( * ) Notice: Subject to any disclaimer, the term of this patent is extended or adjusted under 35 U.S.C. 154(b) by 0 days.

(21) Appl. No.: 10/989,238

(22) Filed: Nov. 15, 2004

(65) Prior Publication Data

US 2005/0158009 A1 Jul. 21, 2005

Related U.S. Application Data

(60) Continuation of application No. 10/413,033, filed on Apr. 14, 2003, now Pat. No. 6,818,544, which is a division of application No. 09/501,177, filed on Feb. 10, 2000, now Pat. No. 6,555,908.

(51) Int. Cl.
  *H01L 21/44* (2006.01)
(52) U.S. Cl. .................. 438/106; 438/113; 438/464
(58) Field of Classification Search ............... 438/107, 438/108, 110, 113, 114, 464, 106
  See application file for complete search history.

(56) References Cited

U.S. PATENT DOCUMENTS

| | | | |
|---|---|---|---|
| 5,646,068 A | 7/1997 | Wilson et al. | 438/108 |
| 5,841,193 A | 11/1998 | Eichelberger et al. | 257/723 |
| 6,111,317 A | 8/2000 | Okada et al. | 257/737 |
| 6,187,680 B1 | 2/2001 | Costrini et al. | 438/688 |
| 6,277,669 B1 | 8/2001 | Kung et al. | 438/106 |
| 6,555,908 B1 * | 4/2003 | Eichelberger et al. | 257/737 |
| 6,818,544 B1 * | 11/2004 | Eichelberger et al. | 438/613 |

FOREIGN PATENT DOCUMENTS

JP  411274245 A  10/1999

OTHER PUBLICATIONS

James E. Kohl et al., "EPIC CSP Assembly and Reliability Methods," originally published in the Proceedings of SC198, Santa Clara, California (May 1998).
James E. Kohl et al., "Low Cost Chip Scale Packaging and Interconnect Technology," originally published in the Proceedings of the Surface Mount International Conference, San Jose, California (Sep. 1997).

* cited by examiner

*Primary Examiner*—Kevin M. Picardat
(74) *Attorney, Agent, or Firm*—Kevin P. Radigan, Esq.; Brett M. Hutton, Esq.; Heslin Rothenberg Farley & Mesiti, P.C.

(57) ABSTRACT

Structure and method for temporarily holding at least one integrated circuit chip during packaging thereof are presented. A support plate has a release film secured to a main surface thereof. The support plate and release film allow UV light to pass therethrough. A UV curable chip adhesive is disposed over the release film for holding the at least one integrated circuit chip. After placement of the at least one integrated circuit chip in the UV curable chip adhesive, the UV curable chip adhesive is cured by UV light shone through the support plate and release film. As one example, the release film includes a UV release adhesive and the UV curable chip adhesive and UV release adhesive have a differential response to UV light which allows curing of the UV curable chip attach without release of the UV release adhesive.

18 Claims, 36 Drawing Sheets

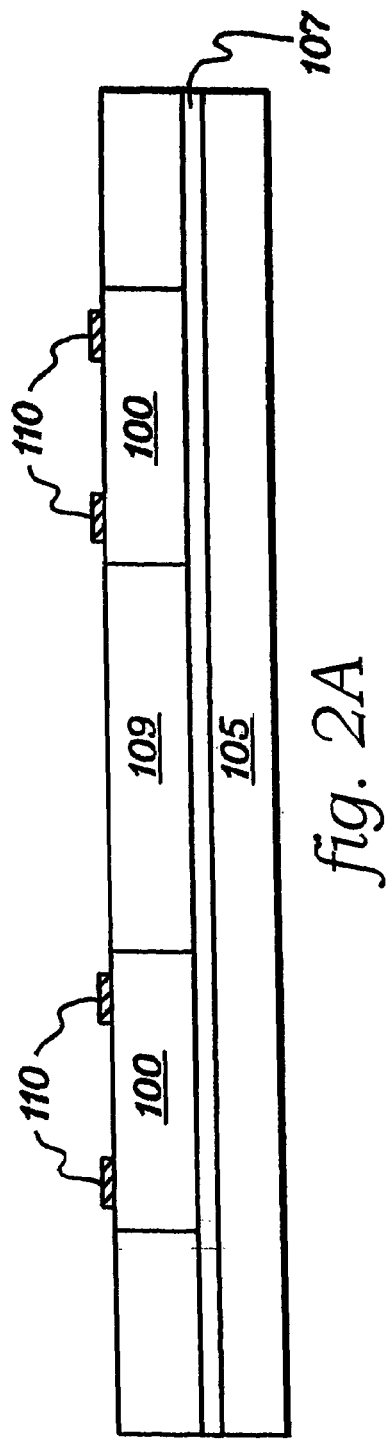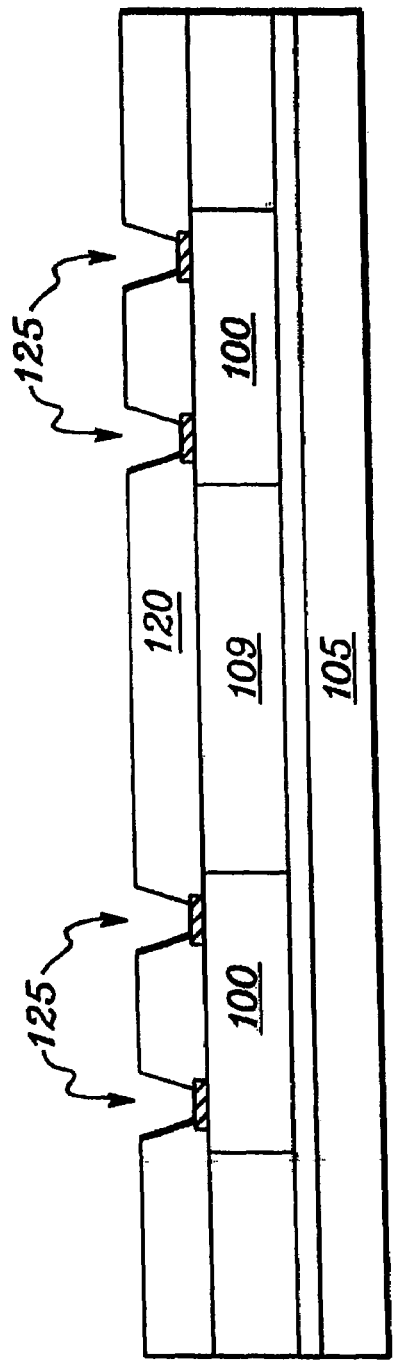

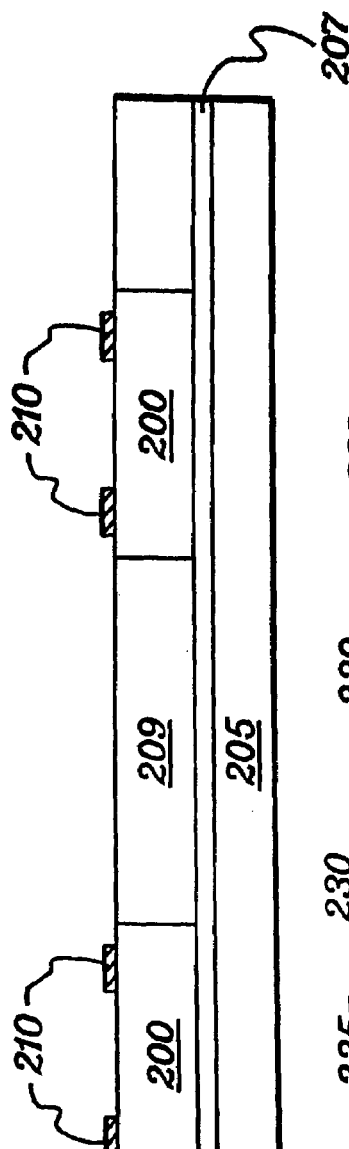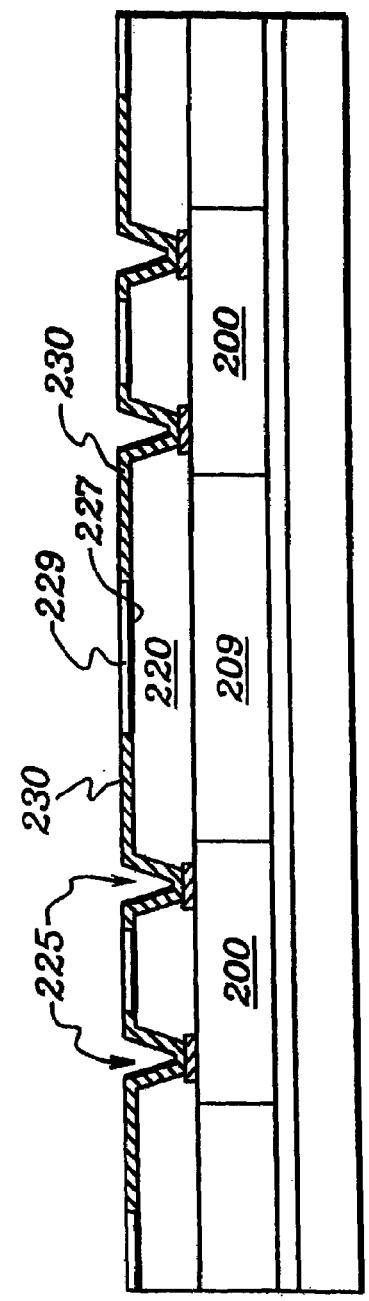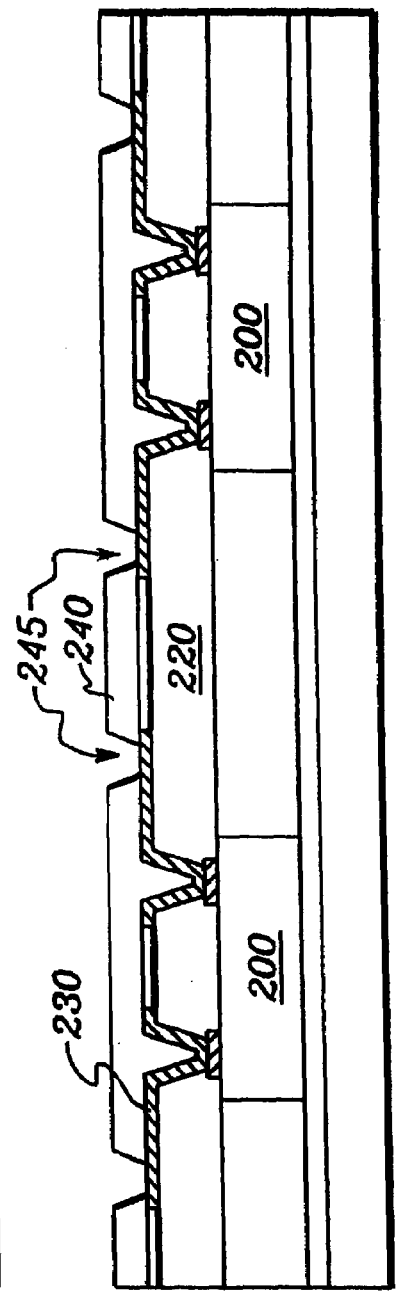
fig. 3A
fig. 3B
fig. 3C

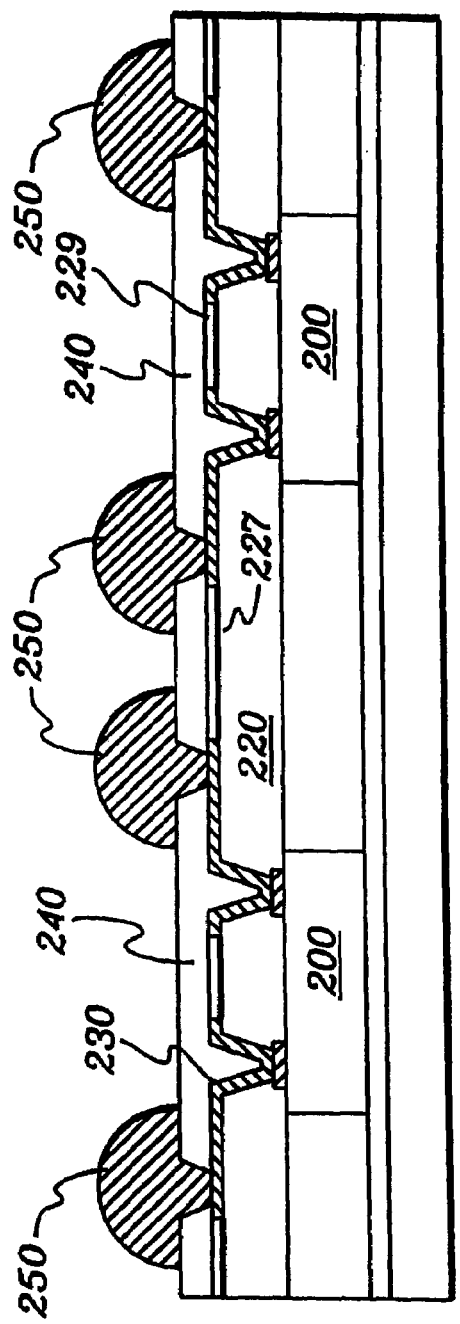
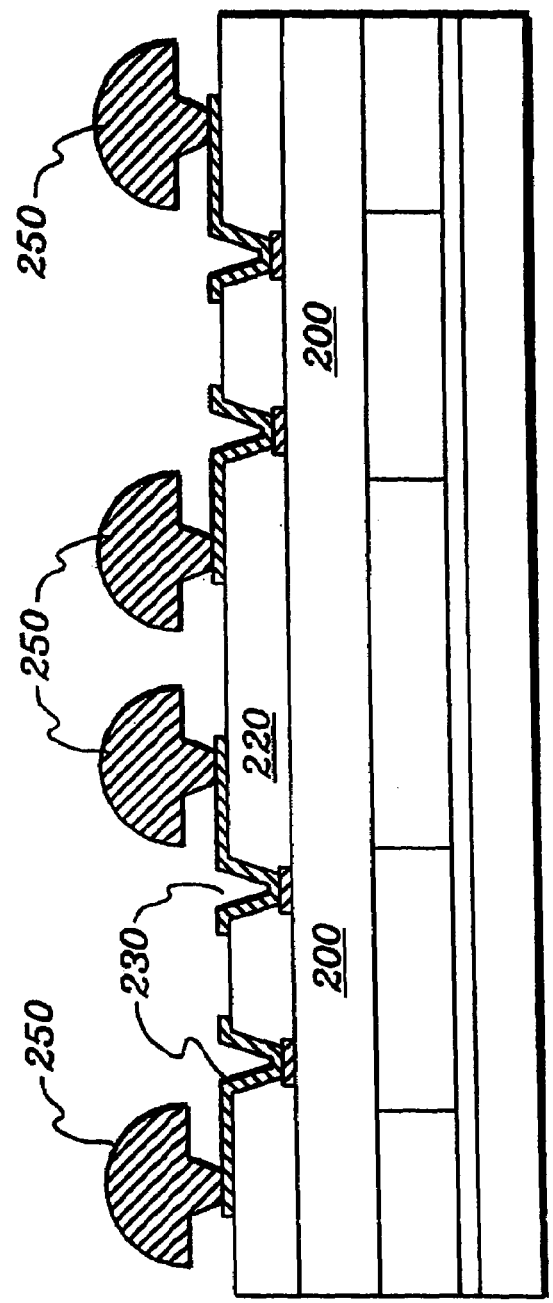
fig. 3D
fig. 3E

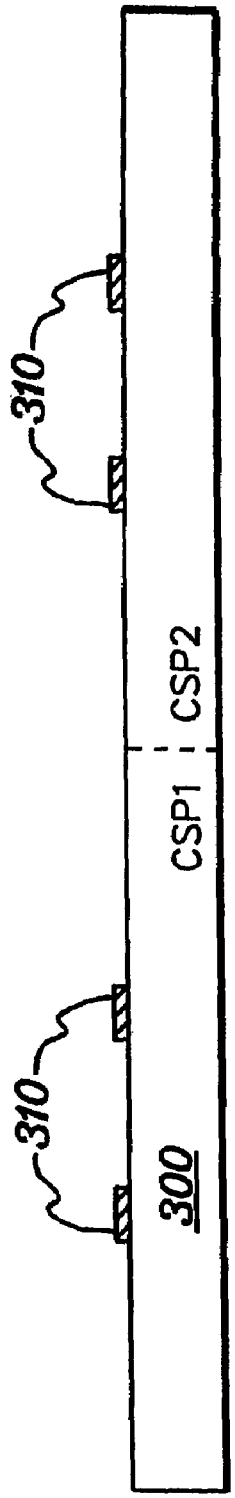
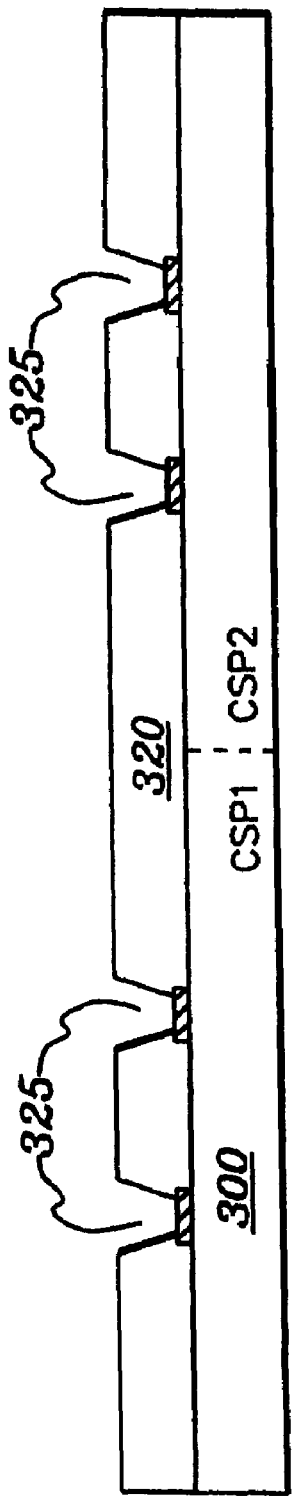
fig. 4A
fig. 4B

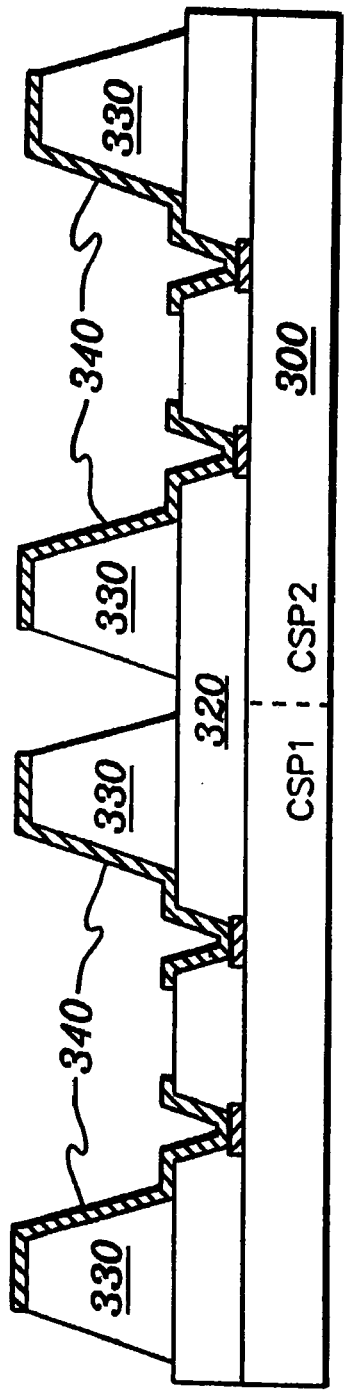
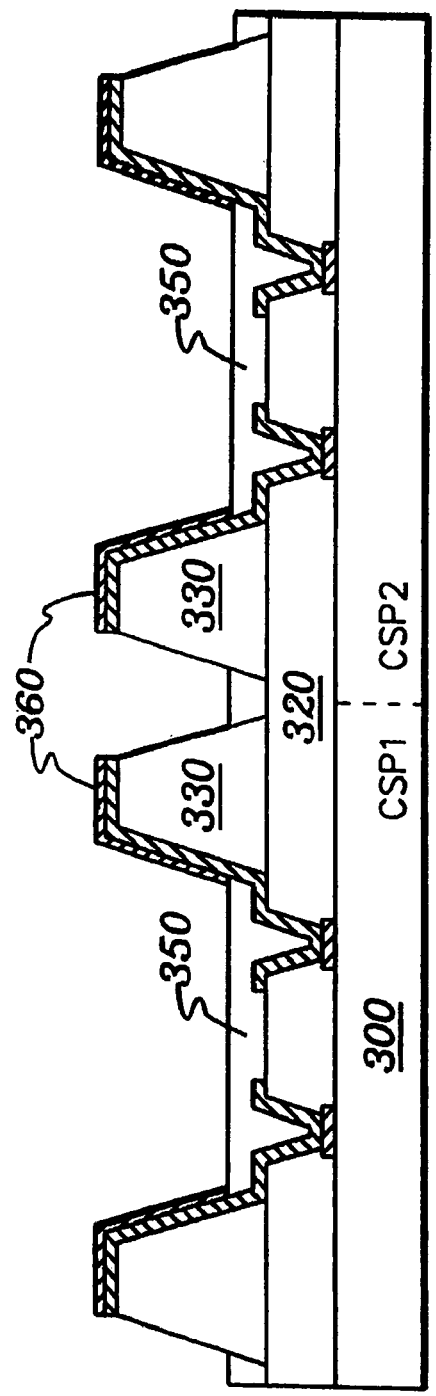

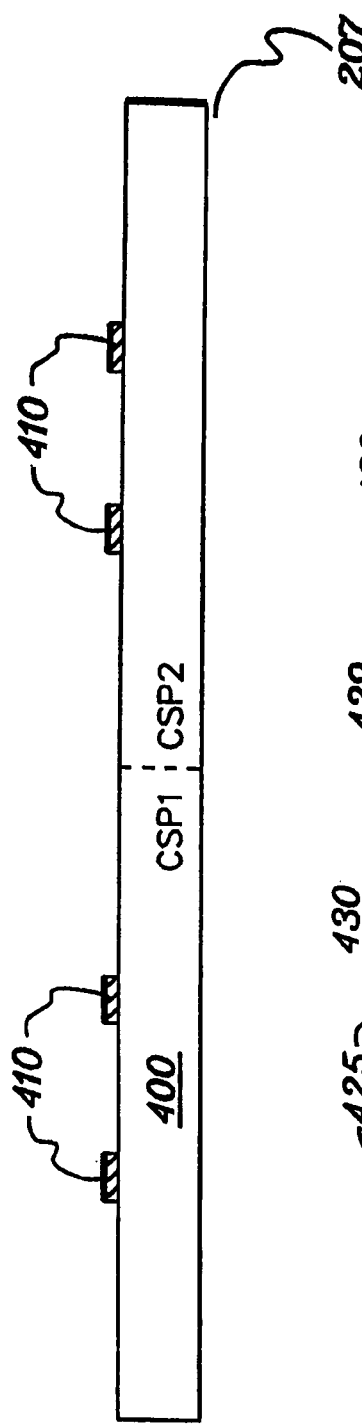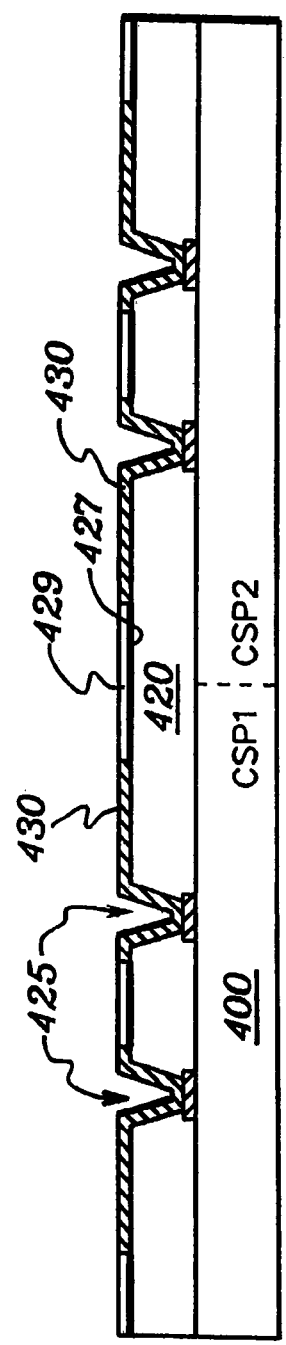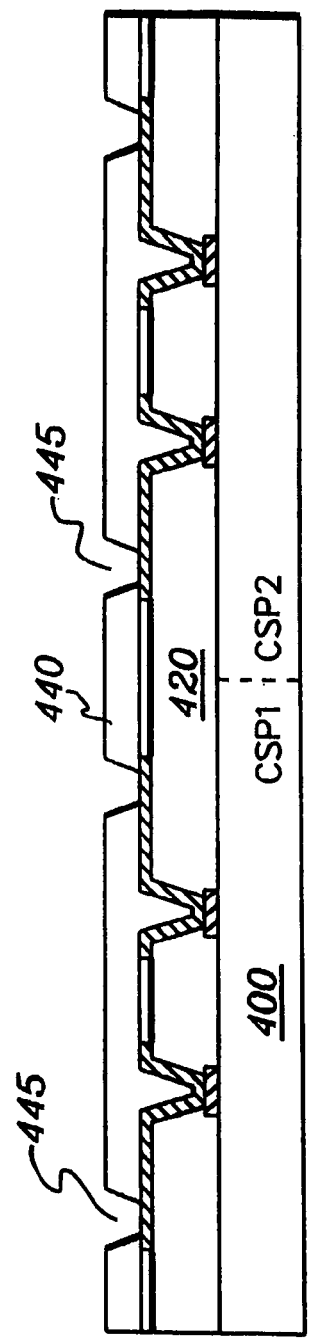

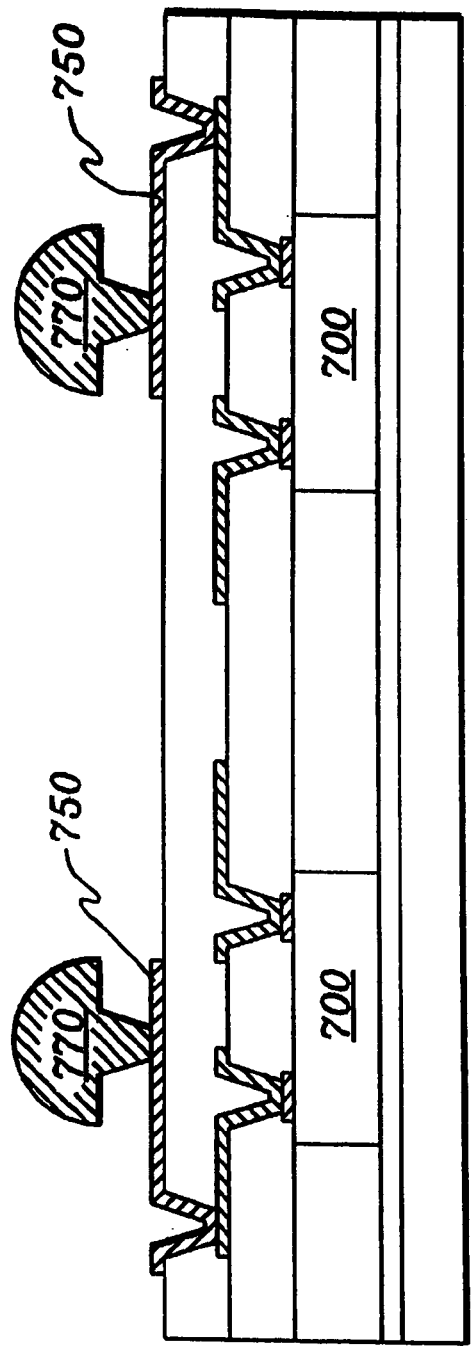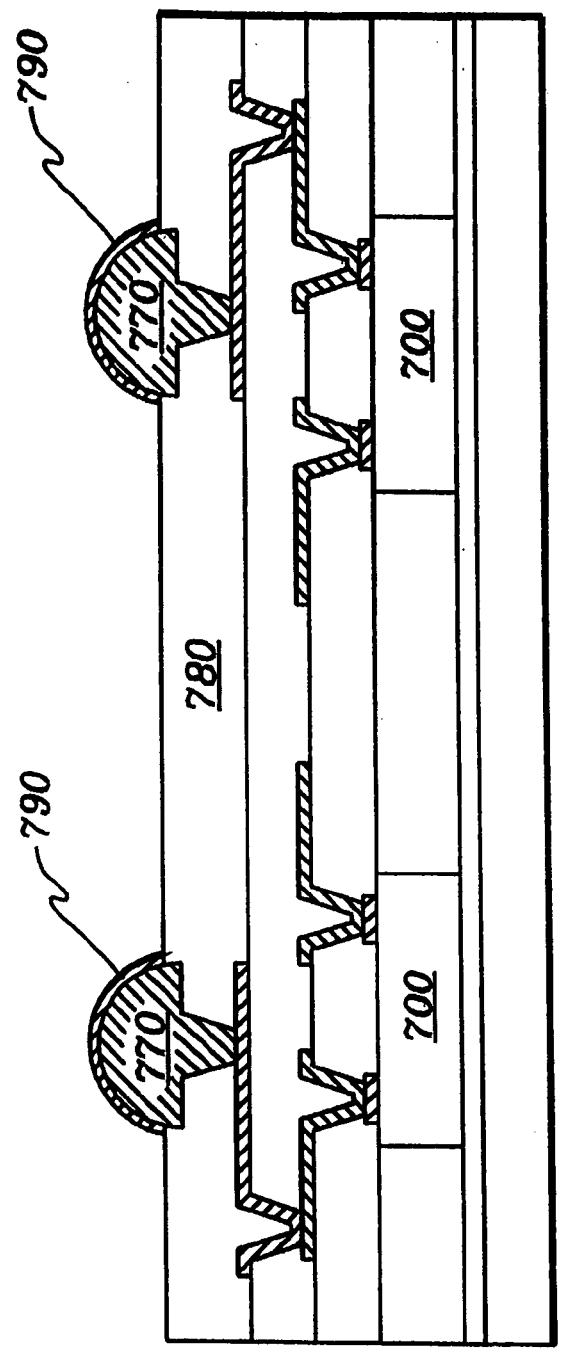
fig. 8E
fig. 8F

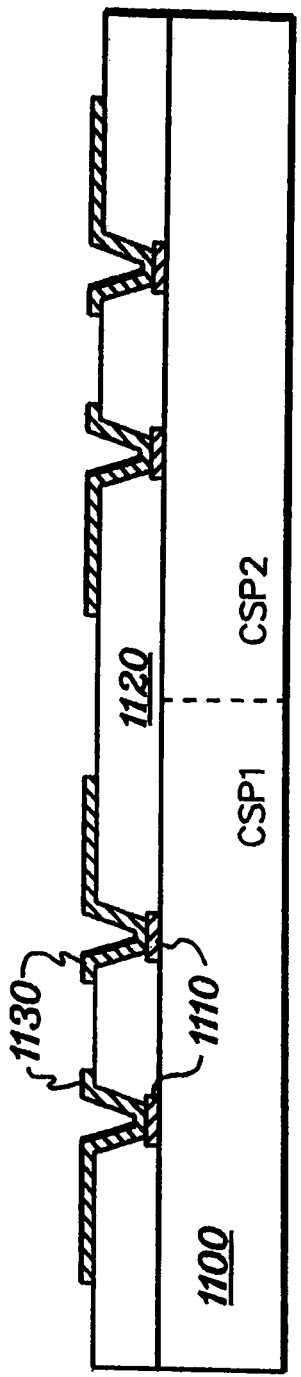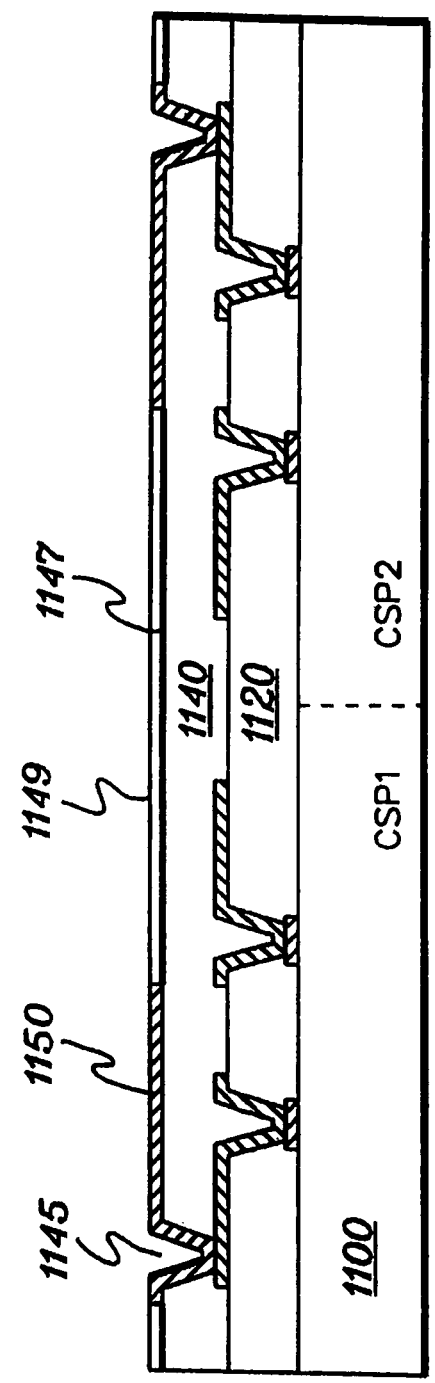

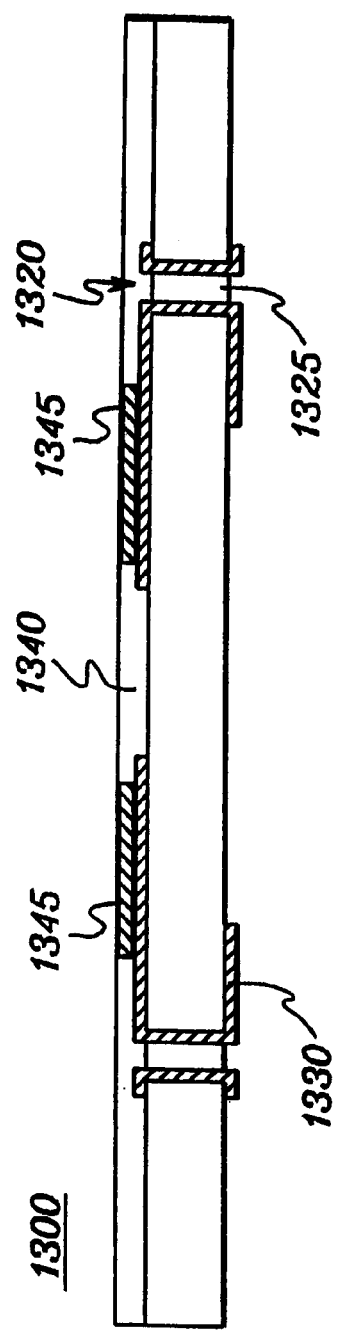
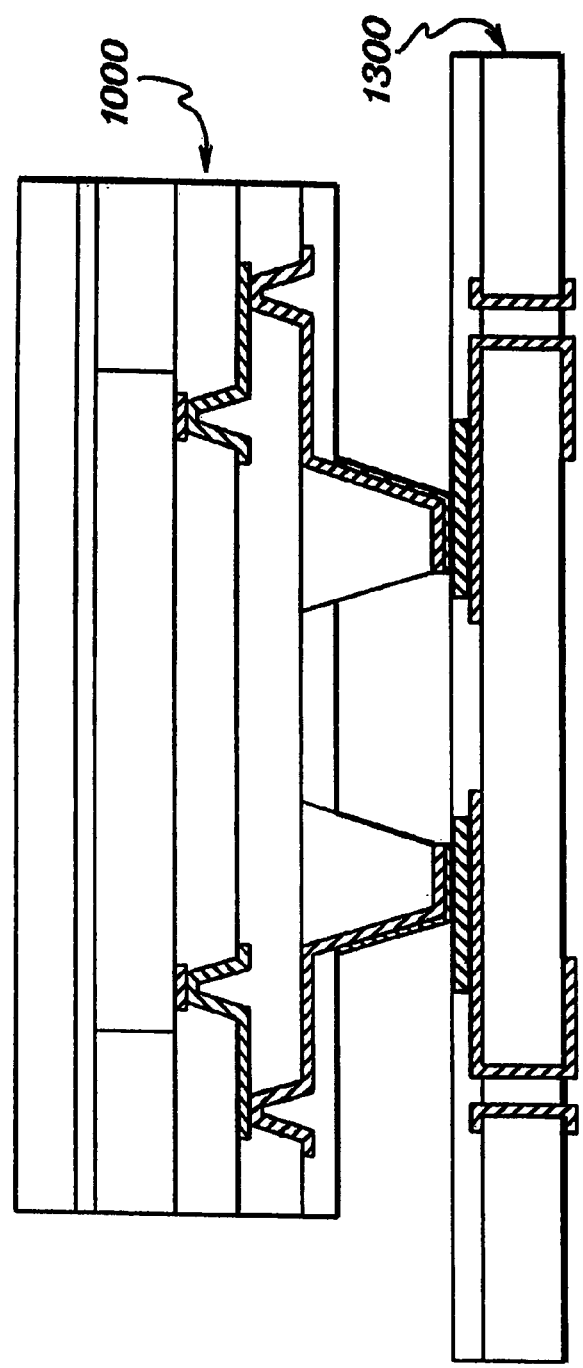

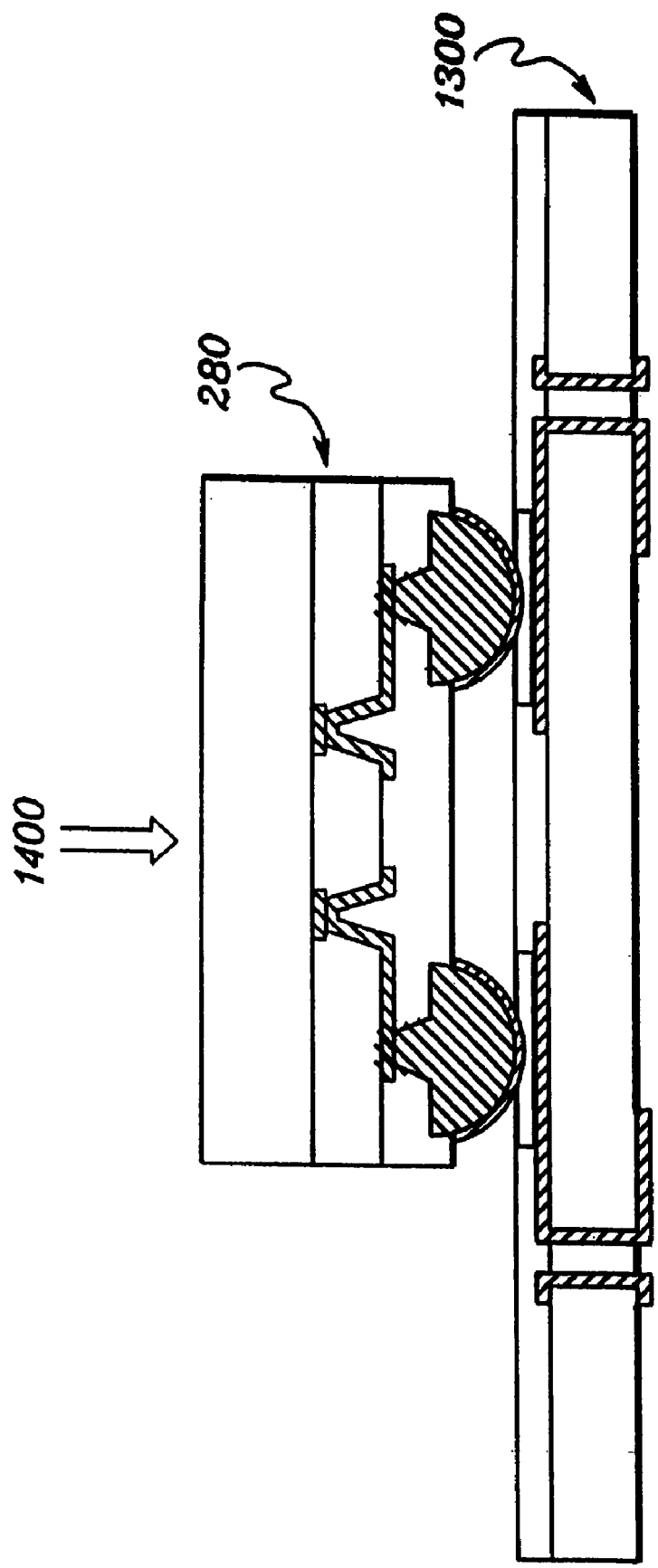

STRUCTURE AND METHOD FOR TEMPORARILY HOLDING INTEGRATED CIRCUIT CHIPS IN ACCURATE ALIGNMENT

CROSS-REFERENCE TO RELATED PATENTS

This application is a continuation of U.S. patent application Ser. No. 10/413,033, filed Apr. 14, 2003, and issued as U.S. Pat. No. 6,818,544 B2 on Nov. 16, 2004, which Letters Patent is a divisional of U.S. patent application Ser. No. 09/501,177, filed Feb. 10, 2000, and issued as U.S. Pat. No. 6,555,908 on Apr. 29, 2003, both of which are hereby incorporated herein by reference in their entirety. Additionally, this application contains subject matter which is related to the subject matter of the following patents, each of which is assigned to the same assignee as this application and each of which is hereby incorporated herein by reference in its entirety:

"Electroless Metal Connection Structures and Methods," U.S. Pat. No. 6,396,148 B1, issued May 28, 2002; and "Integrated Circuit Structures and Methods Employing a Low Modulus High Elongation Photodielectric," U.S. Pat. No. 6,426,545 B1, issued Jul. 20, 2002.

TECHNICAL FIELD

The present invention relates in general to fabricating chips first single or multichip packaging structures and more particularly, to structures and methods for temporarily holding one or more integrated circuit chips in accurate alignment during fabrication of chip scale packaging or multichip modules.

The present invention also relates in general to packaging integrated circuits, and more particularly, to structures and methods for electrically interconnecting and absorbing stress between a first electrical structure and a second electrical structure, wherein the first and second structures may have different coefficients of thermal expansion.

BACKGROUND OF THE INVENTION

"Chips first" packaging structures are discussed in detail in commonly assigned U.S. Pat. No. 5,841,193 by Charles W. Eichelberger entitled, "Single Chip Modules, Repairable Multichip Modules, and Methods of Fabrication Thereof," the entirety of which is hereby incorporated herein by reference. The major approaches to chips first packaging (which are described therein) are the Advance Multichip Module (AMCM) approach, and the High Density Interconnect (HDI) approach, along with its off-shoots including the Plastic Encapsulated MCM. In each of these structures, the chips are covered by a layer of polymer that contains via holes down to interconnection pads on the underlying integrated circuit (IC) chips. Metallization is applied and patterned to provide an interconnect layer on the polymer above the IC chips and also to provide connection to the bond pads of the IC chips themselves.

More particular to the present invention, the problem addressed herein relates to the alignment carrier which is used in the fabrication process of single and multichip modules. In the above-incorporated U.S. Pat. No. 5,841,193, methods for adhesively bonding multiple bare (i.e., unpackaged) IC chips to an alignment carrier are disclosed. In one method, an alignment carrier is formed by coating a glass plate with a hot melt adhesive. Subsequently, back grinding tape is bonded to the hot metal adhesive using double sided adhesive tape. Integrated circuit chips are then attached to the adhesive side of the back grinding tape. One problem with this alignment carrier approach is that the pick and place machine which places the IC chips on the back grinding tape must apply excessive pressure to obtain satisfactory wet out of the adhesive. This is because the adhesive cannot be allowed to flow readily or it would not hold the chips once accurately positioned.

In addition, when the structural filler material of the process described in U.S. Pat. No. 5,841,193 is dispensed and cured, it tends to shrink. This shrinkage puts additional stress on the various alignment carrier materials between the glass plate and the IC chips. This stress tends to pull the IC chips towards the center of the alignment carrier displacing them from the original accurate positioning of the pick and place equipment. The amount of displacement has been found to be too variable to compensate accurately so that the net accuracy of placement of the chips suffers.

The problem addressed herein, therefore, is to provide an alignment carrier and process which accurately holds the IC chips in position throughout the subsequent packaging steps and which requires low pressure to set the IC chips during the pick and place operation.

A further problem addressed herein relates to stresses on the input/output (I/O) bumps of Flip Chips, Chip Scale Packages, and interposers for Ball Grid Array (BGA) packages. Specifically, these bumps connect from the pads on, for example, a Flip Chip or Chip Scale Package to a printed circuit board by soldering to pads on the printed circuit board. The printed circuit board is usually an FR4-type board which has an expansion coefficient of 10 to 20 ppm per degree C. depending on the amount of copper wiring employed and other board configuration parameters. In comparison, a silicon integrated circuit (IC) chip has an expansion coefficient of 2–4 ppm per degree C. As a result of this mismatch, thermal stresses can be set up which tend to fatigue the bump or the material surrounding the bump. After several thermal cycles the solder or adjacent material can fail resulting in an open circuit.

The earliest known process of the type described above is the IBM C4 process in which small solder balls are built up directly on the pads of an IC chip. The chip is then inverted and soldered to pads on a circuit board. This process works well when the substrate is well matched to the silicon IC. Such substrates as silicon or alumina have expansion coefficients of 2 to 6 ppm. When this process is done on an FR4 substrate using large chips (1 to 2 cm) less than 100 thermal cycles can be achieved before failure. To minimize this effect, a process is often used where an epoxy material is caused to flow under the chip to bond the chip to the substrate. This distributes the stresses and increases the number of thermal cycles to failure by an order of magnitude. Two problems exist with this process. First, this so called under-fill process requires time consuming steps of deposition and vacuum flow followed by curing. Second, if a chip is bad it cannot be removed once the under-fill has been applied and cured.

Another alternative is to use solder balls which are large in diameter or height so that the differential expansion is amortized over the length of the solder and the 1% strain limit is not exceeded. (It has been found that if solder strain is kept below 1% during temperature cycling then the number of thermal cycles that the solder can endure without fatigue failure is in the 100 to 1000 cycle range.) The problem in this case is that large solder balls take up a large amount of space which is not usually available on the surface of an IC chip. Various techniques have been developed for screen printing large solder balls or columns but these have the same problem that the solder foot print is large and limits the number of I/O available for a given chip size. In addition, when the part is removed usually some solder remains on the circuit board and some solder remains on the part. This adds a requirement for completely cleaning the solder from the circuit board pads before replacing the part.

Another approach is provided by Tessera Inc. of San Jose, Calif., in which a Kapton "flex circuit" layer is placed over a compliant layer on the IC chip. The compliant layer decouples the chip from the Kapton "flex circuit" layer. The Kapton "flex circuit" connects to the circuit board but does not communicate the expansion differential back to the IC chip since the compliant layer is interspersed between the IC chip and the Kapton "flex circuit". In the Tessera approach, wire or ribbon bonding is used to make connection from the edge of the Kapton circuit layer to the bond pads of the chip. This precludes wiring channels in the area above the bond pads of an IC and thereby limits the number of bond pads which can be accommodated. The approach is expensive because it is not well integrated. It really consists of several components: the Kapton circuit layer, the wire bond or ribbon interconnect, the compliant material and an encapsulant to hold the whole system together. This leads to expensive serial processing steps to connect up the package. (However, the approach does address the problem of thermal mismatch and Tessera chip scale packages can be attached to FR4 circuit boards without under-fill.)

To address the deficiencies of the above processes, presented herein are certain novel structures and methods of fabrication which maintain the strain on the solder or interconnection bumps between a first and second electrical structure to a level lower than the desired 1% level.

DISCLOSURE OF THE INVENTION

In view of the above, an object of the invention is to provide an alignment carrier which accurately holds integrated circuit chips throughout the packaging operations of chip placement, filler application, attach of the process carrier substrate and removal of the alignment carrier.

Another object of the invention is to provide an alignment carrier on which integrated circuit chips can be placed by available high-speed automated pick and place equipment without requiring undue pressure to set the chips in position.

A further object of the invention is to provide an alignment carrier that can be easily removed from the filler and chip surface after the process carrier substrate has been attached.

A yet further object of the present invention is to provide methods for temporarily holding integrated circuit chips in accurate alignment during packaging thereof.

Briefly summarized, the invention comprises in one aspect a structure for temporarily holding at least one integrated circuit chip during packaging thereof. The structure includes a support plate with a release film secured to a main surface thereof. The support plate and release film allow UV light to pass therethrough. The structure further includes a UV curable chip adhesive disposed over the release film for holding the at least one integrated circuit chip during packaging thereof, wherein after accurate placement of the at least one integrated circuit chip in the UV curable chip adhesive, the UV curable chip adhesive can be cured by UV light shone through the support plate and release film.

In a further aspect, a method for temporarily holding at least one integrated circuit chip during packaging thereof is provided. The method includes: providing a support plate with a release film secured to a main surface thereof, the support plate and release film allowing UV light to pass therethrough; providing a UV curable chip adhesive secured over the release film; placing the at least one integrated circuit chip or the UV curable chip adhesive; and shining UV light through the support plate and release film to cure the UV curable chip adhesive, thereby securing the at least one integrated circuit chip where placed.

To restate, provided herein are a novel structure and method for temporarily holding IC chips in accurate alignment during fabrication of chip scale packages and multi-chip modules. The structure/method employs a glass plate with a laminated UV release film. A UV curable adhesive is coated to the back of the UV release film. Integrated circuit chips are then accurately placed on the UV curable adhesive, and the UV curable adhesive is cured using much less irradiation than required to release the UV release film. Advantageously, picking and placing of chips into the UV curable chip attach can occur with low placement pressure but with good wet out and good sealing properties, and at the same time allow for rigid and accurate holding of the alignment of the chips after irradiation with UV light. The UV curable chip attach adhesive comprises a low shear (liquid) material prior to curing thereof. Curing of the UV curable adhesive occurs at a differential energy relative to the energy required to release the UV release adhesive. Alternatively, the structure could be fabricated with different frequencies needed to cure the UV curable chip attach adhesive and release the UV release film. The structure can be easily removed when desired by further irradiating the UV release film with UV light. Further, a process carrier attached after curing of the UV curable chip adhesive could itself be a permanently attached substrate giving added stiffness to the package and added protection for the IC chips.

Still further, another object of this invention is to provide I/O bumps on, for example, a chip scale package or multi-chip module package with sufficient compliance that the packages can be readily mounted on a printed circuit board, such as a conventional printed circuit board, without requiring the use of under-fill between the package and the board.

Another object of this invention is to provide a chip scale package or multichip module package with the attributes of flip chip (small bumps, high I/O capability, and low inductance, high density interconnection), without requiring under-fill when mounting the package to a printed circuit board.

Still another object of the present invention is to provide I/O bumps on chip scale and multichip module packages which allow removal of the packages from a printed circuit board without leaving large differential solder residue.

A further object of the present invention is to provide an I/O bump for chip scale and multichip module packages which has sufficient compliance that temporary electrical contact to a circuit board can be made directly without use of an interposer or sockets.

Briefly summarized, the present invention comprises in one aspect a circuit structure which includes a support surface having at least one contact pad disposed thereon. A dielectric layer is disposed over the support surface and has at least one via opening exposing the at least one contact pad. At least one non-conductive compliant bump is disposed above the dielectric layer, and at least one metal layer is provided which includes metal over a surface of the at least one non-conductive compliant bump. The at least one metal layer facilitates electrical coupling of the metal over the surface of the at least one non-conductive compliant bump with the at least one contact pad on the support surface.

In another aspect, a circuit structure is provided which includes a support surface having at least one contact pad disposed thereon. A dielectric layer is disposed over the support surface and includes at least one via opening therein exposing the at least one contact pad. A metal layer is disposed over the dielectric layer and extends into the at least one via opening to electrically contact the at least one contact pad. The circuit structure further includes at least one mushroom-shaped conductive bump disposed above the dielectric layer and electrically coupling to the metal layer. Each mushroom-shaped conductive bump has a stem portion and a top portion, with the stem portion electrically coupling the top portion to the metal layer.

In yet another aspect, a method of fabricating a circuit structure is provided which includes: providing a support surface having at least one contact pad disposed thereon; disposing a dielectric layer over the support surface, and forming at least one via opening in the dielectric layer to expose the at least one contact pad; providing at least one non-conductive compliant bump over the dielectric layer; and forming at least one metal layer which includes metal over a surface of the at least one non-conductive compliant bump, and which facilitates electrical coupling of the metal over the surface of the at least one non-conductive compliant bump with the at least one contact pad of the support surface.

In a further aspect, provided herein is a method of fabricating a circuit structure which includes: providing a support surface having at least one contact pad formed thereon; disposing a dielectric layer above the support surface, and forming at least one via opening in the dielectric layer to expose the at least one contact pad; disposing a metal layer over the dielectric layer and extending into the at least one via opening to electrically contact the at least one contact pad; and providing at least one mushroom-shaped conductive bump above the dielectric layer and electrically coupled to the metal layer, wherein each mushroom-shaped conductive bump has a stem portion and a top portion, said stem portion electrically coupling said top portion to said metal layer.

To restate, provided herein are structures and methods which employ a compliant photo patternable polymer either as the core of an I/O bump or to provide compliance under a solid conductive bump. In either case, compliance is sufficient to absorb the expansion differential between, for example, a chip scale package and an FR4-type printed circuit board to which the package is solder mounted. The structures disclosed herein have the advantage of flip chip technology, but can be mounted directly on an FR4-type circuit board without the requirement for under-fill for reliability. Fabrication methods are disclosed for providing the structure directly on a wafer or for fabricating the structure in a panel of individual chips. Both single and multichip structures are disclosed. Also provided is a novel self-aligning solder mask in which the solder mask polymer is coated on the bump, and runs off the top of the bump leaving it exposed for subsequent plating of a solderable finish.

The structures and methods preferably employ a low elastic modulus and high ultimate elongation property material (LMHE dielectric). The disclosed material is photo patternable and can be patterned with a very short exposure time. Further, the material can be developed in thick sections with excellent resolution using simple dip tank development techniques as opposed to more complicated spray development techniques. The low modulus property essentially eliminates any stress on solder or other ball-type joints that interconnect, for example, packaged integrated circuit chips to a printed circuit board. The high elongation property allows the dielectric to stretch significantly without failure to the dielectric. Various structural configurations that make use of the LMHE dielectric material are described.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which:

FIG. 2A is a cross-sectional elevational view of one embodiment of a panel of singulated integrated circuit (IC) chips surrounded by filler mounted on a substrate to employ a structure in accordance with the principles of the present invention;

FIG. 2B is a cross-sectional elevational view of the structure of FIG. 2A with a compliant dielectric layer disposed thereon and which has multiple via openings defined therein in accordance with the principles of the present invention;

FIG. 3A is a cross-sectional elevational view of one embodiment of a panel of singulated integrated circuit (IC) chips surrounded by filler mounted on a substrate to employ a structure in accordance with the principles of the present invention;

FIG. 3B is a cross-sectional elevational view of the structure of FIG. 3A showing a compliant dielectric sprayed and patterned with via holes, a seed metal layer applied thereto, electro-deposited resist applied and patterned, and a metal layer plated up as defined by the resist in accordance with the principles of the present invention;

FIG. 3C is a cross-sectional elevational view of the structure of FIG. 3B after application of a positive resist and patterning thereof with via holes exposing portions of the metal layer from which conductive bumps are to be grown in accordance with the principles of the present invention;

FIG. 3D is a cross-sectional elevational view of the structure of FIG. 3C after growing of solid metal bumps resulting in mushroom-shaped interconnect in accordance with the principles of the present invention;

FIG. 3E is a cross-sectional elevational view of the structure of FIG. 3D after the positive resist, electro-deposited resist, and seed metal layers have been removed in accordance with the principles of the present invention;

FIG. 4A is a cross-sectional elevational view of one embodiment of a wafer with two integrated circuit chips defined therein to employ a structure in accordance with the principles of the present invention;

FIG. 4B is a cross-sectional elevational view of the structure of FIG. 4A with a compliant dielectric applied to an upper surface of the wafer and via holes formed in the dielectric to the bond pads of the two integrated circuit chips in accordance with the principles of the present invention;

FIG. 4C is a cross-sectional elevational view of the structure of FIG. 4B showing completed compliant polymer bumps and patterned metallization thereon in accordance with the principles of the present invention;

FIG. 4D is a cross-sectional elevational view of the structure of FIG. 4C showing application of a self-patterning solder mask and formation of a solderable finish on exposed portions of the patterned metallization residing on the compliant polymer bumps in accordance with the principles of the present invention;

FIG. 5A is a cross-sectional elevational view of one embodiment of a wafer with two integrated circuit chips defined therein to employ a structure in accordance with the principles of the present invention;

FIG. 5B is a cross-sectional elevational view of the structure of FIG. 5A with a compliant dielectric layer shown thereon formed and patterned with via holes, and with a seed metal layer applied, electro-deposited resist applied and patterned, and a metal layer plated up as defined by the resist in accordance with the principles of the present invention;

FIG. 5C is a cross-sectional elevational view of the structure of FIG. 5B with a positive resist applied and patterned with via openings to expose portions of the metal layer where interconnection bumps are to be grown in accordance with the principles of the present invention;

FIG. 8E is a cross-sectional elevational view of the structure of FIG. 8D obtained after removing the positive resist, electro-deposited resist, and seed metal layers in accordance with the principles of the present invention;

FIG. 8F is a cross-sectional elevational view of the structure of FIG. 8E after application of a self-patterning solder mask and formation of a solderable finish on exposed portions of the conductive bumps in accordance with the principles of the present invention;

FIG. 12A is a cross-sectional elevational view of one embodiment of a wafer with two integrated circuit chips defined therein and a first dielectric layer disposed thereon patterned with via openings and a metal 1 layer provided above the first dielectric layer connected to exposed bond pads on the wafer in accordance with the principles of the present invention;

FIG. 12B is a cross-sectional elevational view of the structure of FIG. 12A showing application of a second dielectric layer and patterning thereof with via openings, formation of a seed metal layer above the second dielectric layer, electrodeposited resist applied and patterned, and formation of a metal 2 layer plated as defined by the resist in accordance with the principles of the present invention;

FIG. 14A is a cross-sectional elevational view of a two-sided printed circuit board with plated through holes and a solder mask and stenciled solder paste disposed thereon to which modules formed in accordance with the principles of the present invention are to be applied;

FIG. 14B is a cross-sectional elevational view of the structure of FIG. 14A and the structure of FIG. 7 shown electrically connected thereto in accordance with the principles of the present invention;

FIG. 15 is a cross-sectional elevational view of the structure of FIG. 14A wherein the CSP module of FIG. 5G being temporarily electrically connected thereto in accordance with the principles of the present invention.

BEST MODE FOR CARRYING OUT THE INVENTION

Figure 1A:
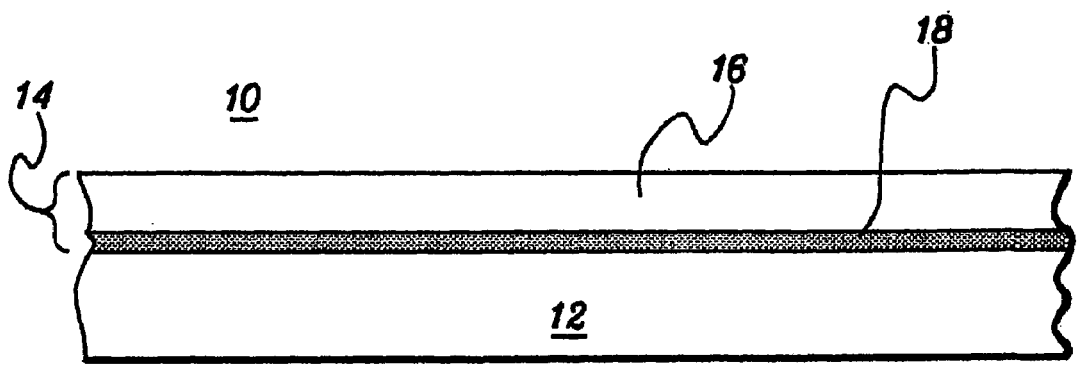
FIG. 1A is a cross-sectional elevation view of one embodiment of an alignment carrier and UV release tape laminated to one side thereof in accordance with the principles of the present invention.
Figure 1B:
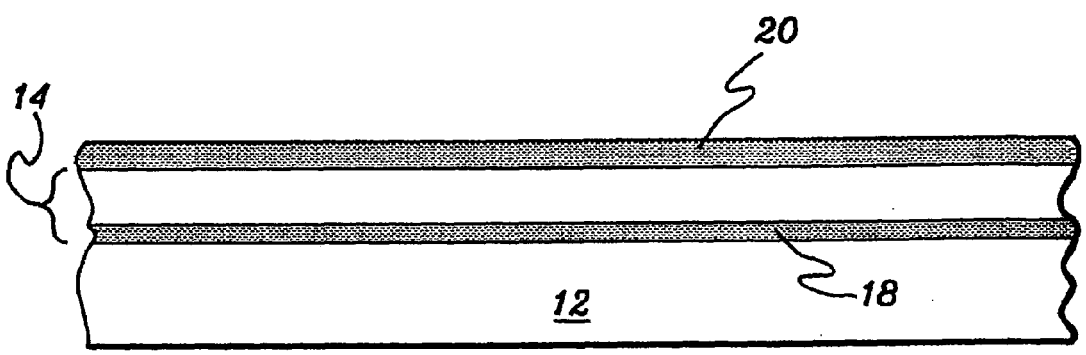
FIG. 1B is a cross-sectional elevational view of the structure of FIG. 1A with a UV curable chip attach adhesive sprayed on top of the UV release tape in accordance with the principles of the present invention.

FIG. 1A depicts one embodiment of a process structure, generally denoted 10, in accordance with the principles of the present invention. Structure 10 includes an alignment carrier 12 and a release tape 14, both of which allow ultraviolet (UV) light to pass therethrough. In one embodiment, alignment carrier 12 comprises a glass plate and release tape 14 comprises a UV releaseable tape which includes a polyester film 16 and a UV releaseable adhesive 18. The UV release tape 14 is laminated to glass plate 12 using a roll laminator. Roll lamination is well known in the art. The UV release tape or film is designed to lose its adhesion when irradiated with UV light of a particular frequency or energy level. One possible UV release film is Adwill D-218 available from LINTEC of Tokyo, Japan.

In accordance with the principles of the present invention, a UV curable chip attach adhesive 20 is spray coated on the non-adhesive side of UV release film 14. This UV curable chip adhesive 20 has low holding strength in its uncured (e.g., liquid) state but it requires very little pressure to wet out on the surface of IC chips which are placed into the adhesive. A suitable UV curable adhesive formulation is achieved by combining 120 grams of acrylated urethane oligomer, particularly an alipatic diacrylate with a polyether backbone, a molecular weight>5000 and functionality=2 available as UCB IRR 245™ from UCB Chemicals of Smyrna Ga.; 223.5 grams propylene glycol methyl ether acetate, available from Shipley of Newton, Mass.; 9.5 grams of 2-benzyl-2-N,N-dimethylamino-1-(4-morpholinophenyl)-1-butanone photo initiator available as Irgacure 369™ from Ciba-Geigy Corporation of Hawthorne, N.Y.; and 0.03 grams of a fluoroaliphatic polyester wetting agent available as FC430™ from 3M Specialty Chemicals of St. Paul, Minn. The combination is mixed thoroughly and filtered through a 1 micron absolute filter to remove any particulate. This material is then sprayed onto film 14 to form adhesive coating 20, e.g., in the 3 to 5 micron thickness range.

Preferred ranges for the various components of the mix, assuming that the UCB IRR 245™ is held constant, are discussed below. The amount of propylene glycol methyl ether acetate required as a solvent is governed by the thickness desired and the characteristics of the spray system. Increasing the solvent will allow thinner coatings to be sprayed; decreasing the solvent will allow thicker coatings to be sprayed. Increases significantly beyond 50% may result in uneven drying and therefore uneven thickness. Decreases significantly below the 50% level often result in improper flow out during spray, which will produce orange peel effects when air-type spray equipment is used. The Irgacure 369™ curing agent can be increased by 100% with no adverse effects. The cost of the material will be increased and the cure time will be slightly decreased. Decreasing the curing agent will increase the curing time. Significant reduction below 50% may result in incomplete surface cure due to air inhibition. The FC430™ wetting agent can be increased by 25% with no adverse effect. Increasing by significantly greater than this amount may result in the filler layer dewetting on the carrier when it is applied. The FC430™ wetting agent can be decreased by 25% with no adverse effect. Decreasing by significantly greater than this amount may result in the chip attach adhesive not properly wetting the non-adhesive side of the UV release film 14.

Figure 1C:
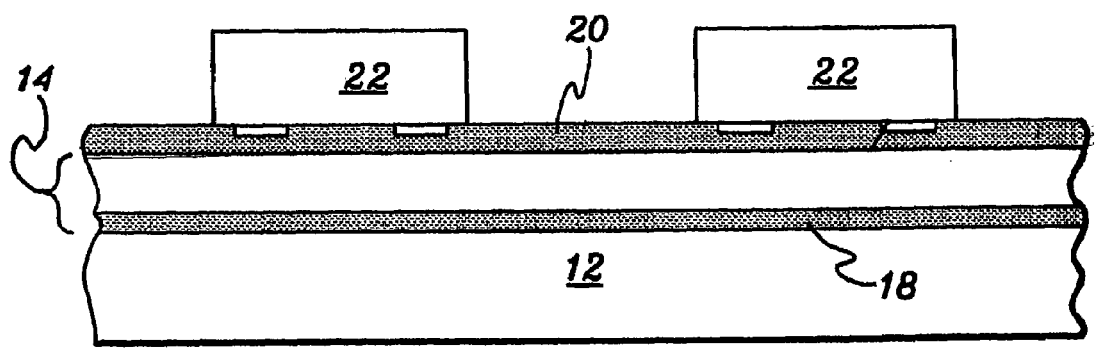
FIG. 1C is a cross-sectional elevational view of the structure of FIG. 1B after integrated circuit chips have been placed face down into the UV curable chip attach adhesive in accordance with the principles of the present invention.

As shown in FIG. 1C, one or more integrated circuit (IC) chips 22 are next accurately placed face down on the UV curable chip adhesive 20. A minimum placement pressure of 250 gm for a 20 mm square IC is more than enough to adequately wet the surface of the chips for both adhesion to the alignment carrier and to seal the top of the chips from the filler which will be subsequently applied. This level of force is available on many commercially available, high accuracy IC chip pick and place machines. One such machine which can be used with this adhesive is the QUAD APS-1 automated pick and place machine available from QUAD Systems of Willow Grove, Pa.

Figure 1D:
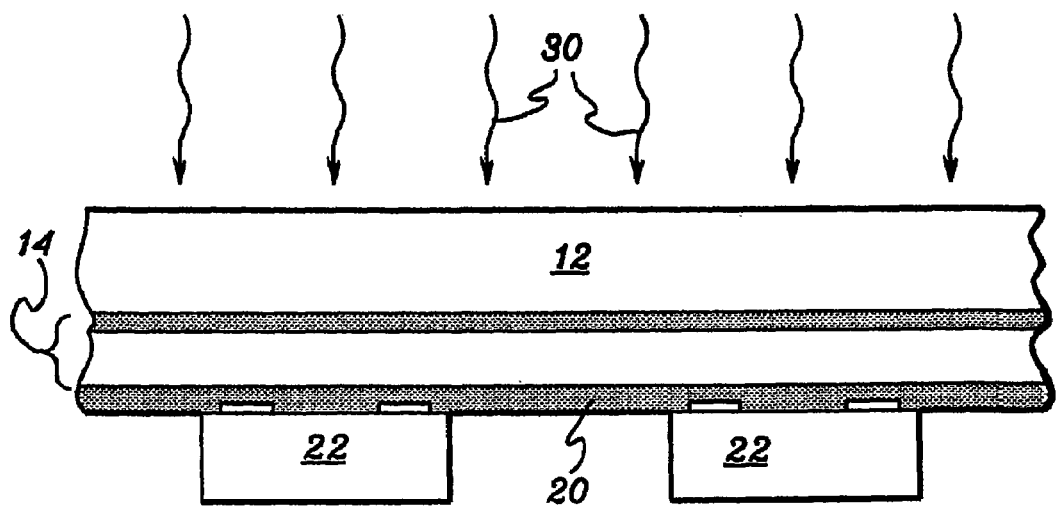
FIG. 1D is a cross-sectional elevational view of the structure of FIG. 1C showing UV irradiation of the UV curable chip attach adhesive through the alignment carrier and UV release tape in accordance with the principles of the present invention.

At this point, the IC chips are only held by the low tack of the UV curable chip adhesive 20. To rigidly hold the chips in place so that they will not move during the filler application and curing processes (see the above-incorporated U.S. Pat. No. 5,841,193), UV light 30 is used to cure adhesive 20 as shown in FIG. 1D. The UV light 30 is shone through the alignment carrier 12 and release tape 14 to cure adhesive 20. The level of UV irradiation required to sufficiently cure the adhesive is preferably much less than the amount required to release the UV release adhesive. Alternatively, the UV curable chip attach 20 could respond to a different frequency than that at which the UV release adhesive responds. In one embodiment, adhesive 20 is cured to rigidly hold the chips in place using a UV conveyer curing system operated at a speed of 40 inches/sec. and passing under one focused medium pressure mercury lamp at 200W/linear inch.

This corresponds to a total UV energy of 75 mJ/cm$^2$ at a wavelength of 365 nM. To release the UV releasable film it has been found that an energy of 3000 mJ/cm$^2$ at 365 nM is required. This large differential allows the chip attach adhesive to be cured without causing the UV release film to release. In an alternative embodiment, a curing agent can be used in the chip attach adhesive which responds to a wavelength other than 365 nM. As an example, Irgacure 784 DC™ can be is substituted for Irgacure 369™ in the above formulation. Irgacure 784 DC™ is available from Ciba Specialty Chemicals Additives of Tarrytown, N.Y. Its generic chemical designation is Bis($\eta$5-2,4-cyclopentadien-1-yl)-bis-[2,6-difluoro-3-(1H-pyrrol-1-yl)phenyl]titanium. When this is done the chip attach adhesive is sensitive to higher wavelengths of light. Irradiation of 200 mJ/cm$^2$ in the 480–460 nM range will cure the chip attach adhesive but will not release the UV release film which only releases in the presence of 365 nM wavelength UV irradiation.

Figure 1E:
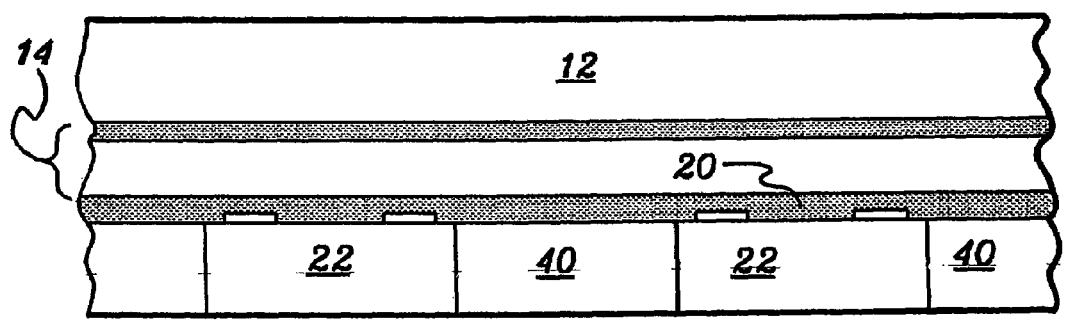
FIG. 1E is a cross-sectional elevational view of the structure of FIG. 1D after dispensing of a structural filler material, curing of the filler and lapping of the filler and IC chips in accordance with the principles of the present invention.

After curing the UV chip attach adhesive, filler material is dispensed to surround the chips on all uncovered sides. After the filler is applied and cured, it is lapped to form a planar back surface. FIG. 1E depicts structural filler material 40 surrounding at least one side surface of each integrated circuit chip so as to hold the chips in spaced, planar relation. Filler dispensing and lapping are disclosed in the above-incorporated U.S. Pat. No. 5,841,193.

As noted above, when the filler is cured it tends to shrink. This puts stress on the IC chips and tends to move them toward the center of the panel. This stress is resisted by the elements of the alignment carrier. Since the IC chips are rigidly held by a thin UV curable chip adhesive they do not move due to creep of this adhesive or due to strain of the adhesive because it is only 3 to 5 microns thick. The UV release tape face material is polyester which has a high elastic modulus so although it is 188 microns thick it does not allow significant motion due to the shrinkage forces of the filler, which is of the same order of thickness. Finally the UV release adhesive has very high tack and is only 15 microns thick. This adhesive is well adhered to the glass surface since the roll lamination process puts a high pressure at the point of contact of the rollers thus providing essentially 100 percent wet out.

Figure 1F:
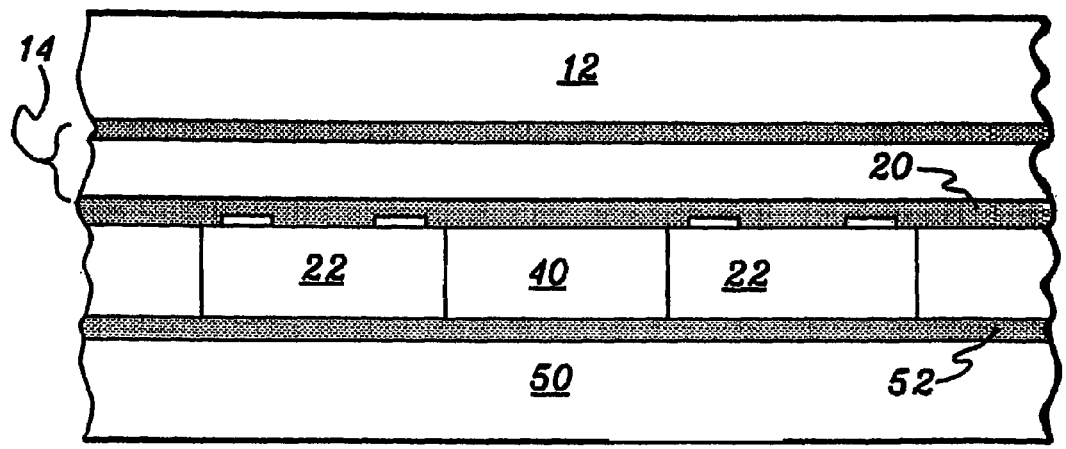
FIG. 1F is a cross-sectional elevational view of the structure of FIG. 1E showing attachment of a permanent adhesive and process carrier substrate to the exposed filler and IC chip surface in accordance with the principles of the present invention.

The next step in the fabrication process is to attach a process carrier to the lapped surface. As shown in FIG. 1F, process carrier 50 can be a substrate permanently bonded to the lapped filler and IC chips using a permanent attach adhesive 52. This process carrier has two functions. First, the carrier holds the chips in accurate position during subsequent processing, and if the attachment is permanent, the process carrier can be the final substrate for the modules.

The process for permanent attachment of a substrate is as follows: An alumina substrate 50 mil thick is coated with the attachment adhesive by spreading approximately 10 gm of adhesive over an approximately 4.5 inch square substrate. A suitable adhesive is Two Ton Epoxy available from Devcon of Riviera, Fla. The substrate is placed adhesive side down on the lapped surface. The assembly is placed in a heated lamination press at a temperature of 70° C. The force is slowly raised to 1 ton which applies a pressure of 100 psi to the assembly. This squeezes much of the adhesive out from between the two surfaces and also eliminates the entrapped air. The dwell time in the press is 30 minutes. When the assembly is removed from the press the process carrier substrate is rigidly bonded to the IC chips so that when the alignment carrier is removed the chips will maintain their position.

Figure 1G:
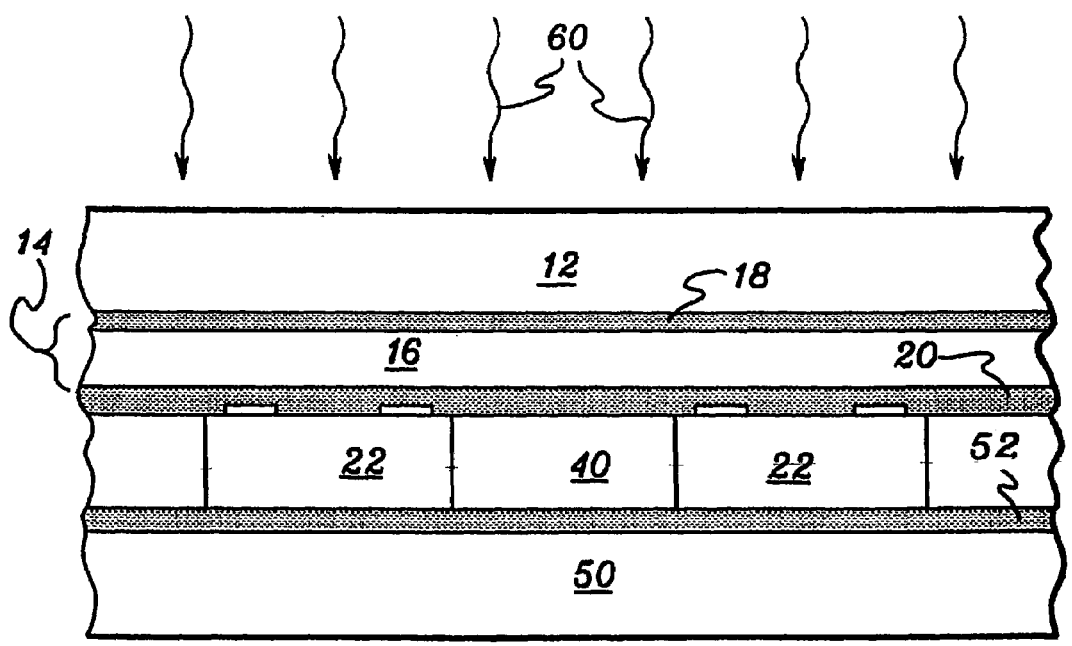
FIG. 1G is a cross-sectional elevational view of the structure of FIG. 1F showing UV irradiation through the alignment carrier to activate the UV release adhesive in accordance with the principles of the present invention.
Figure 1H:
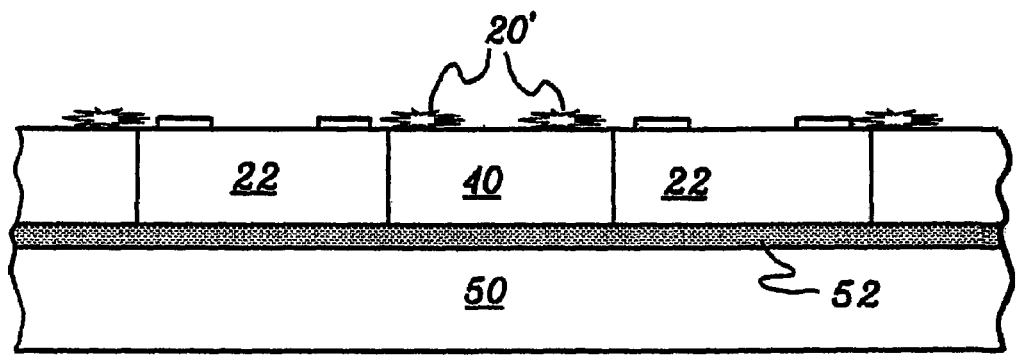
FIG. 1H is a cross-sectional elevational view of the structure of FIG. 1G after the UV release adhesive has been activated, removing the alignment carrier, and after the UV release tape has been removed, leaving chip attach adhesive residue in accordance with the principles of the present invention.
Figure 1I:
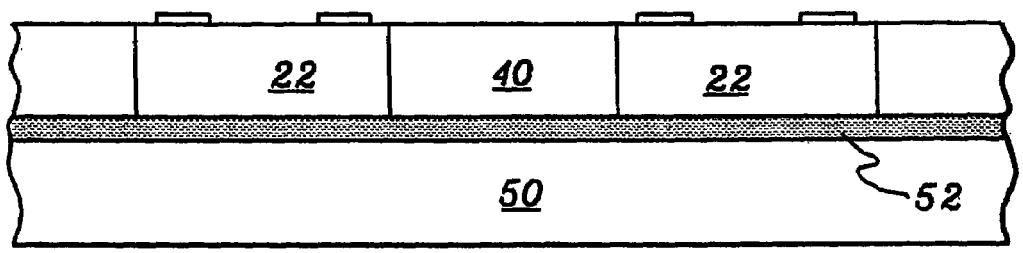
FIG. 1I is a cross-sectional elevational view of the structure of FIG. 1H after acetone and plasma cleaning to remove the chip attach residue in accordance with the principles of the present invention.

To remove the alignment carrier, the UV release tape 14 is irradiated with UV light 60 (FIG. 1G) through the glass alignment plate. It has been found that a total of 3 Joules/cm$^2$ at 365 nM is sufficient to release the adhesive disclosed above. Total removal of the alignment carrier 12 can be effected by lightly prying at the corners between the alignment carrier and the UV release tape 14. Once the alignment carrier and UV release tape are removed, some residue of the UV curable chip attach adhesive 20' will remain as shown in FIG. 1H. This residue can be removed by a soak of Acetone for one minute followed by 10 to 20 minutes in 30% percent $CF_4/O_2$ plasma at 400W in an LFE 1000 barrel etcher. FIG. 1I depicts the substrate and chips with structural filler material surrounding the sides thereof after the chip attach adhesive 20' has been removed. At this point, the substrate with the chips attached can be processed as outlined in the above-incorporated U.S. Pat. No. 5,841,193. Note that when processing is complete, the substrate 50 can remain to give the package added stiffness and provide added protection for the IC chips.

As noted briefly above, disclosed herein are various dielectric and metal structures that can absorb differential stress between a first electrical structure and a second electrical structure which are bump interconnected, such as between a printed circuit board and an associated packaged or bumped integrated circuit (IC) chip attached thereto with solder interconnect. A low modulus high elongation (LMHE) dielectric material is preferably employed to absorb strain due to expansion mismatch again between, for example, an FR4-type printed circuit board and a packaged IC chip module.

A preferred formulation for this LMHE dielectric material, optimized for application by spray coating, is formulated by combining 600 grams of acrylated aromatic urethane oligomer with functionality of 2.3 and a molecular weight of 1500 available from UCB Chemicals of Smyrna, Ga. as EBE 6700™; 680 grams of propylene glycol methyl ether acetate, available from Shipley of Marlborough, Mass.; 18 grams of 2-benzyl-2-N-N-dimethylamino-1-(4-morpholinophenyl)-1-butanone photo initiator available from Ciba-Geigy Corporation of Hawthorne, N.Y. as Irgacure 369™; 12 grams of methacryloxypropyl trimethoxysilane available from Silar of Scotia, N.Y. and 2.4 grams of fluoroaliphatic polyester wetting agent, available from 3M Specialty Chemicals of St. Paul, Minn. as FC430™. The combination is mixed thoroughly and filtered through a 1 micron absolute filter to remove any particulate. This material can then be sprayed to form coatings of thickness varying from 20 to 100 microns.

Two structure variations are described herein. Both structures make use of a high elongation and low modulus polymer or dielectric to absorb the expansion differential between the I/O bumps on a package and the circuit board to which they are connected. In one structure the bump is formed by the high compliance polymer and in the other structure the bump is, e.g., solid copper with compliance afforded by the upper layers of dielectric to which the bump is attached. In addition, both structures can be fabricated from individual die formed into a panel or directly on the wafer. Two sets of drawings are provided. FIGS. 2A–2E and 3A–3G depict polymer bumps and solid copper bumps, respectively, processed on a panel. FIGS. 4A–4E and 5A–5G depict polymer bumps and solid copper bumps, respectively, processed directly on a wafer. It should also be noted that the fabrication processes can be the same for a Chip Scale Package (CSP) which contains a single chip and a multichip module (MCM) which contains more than one interconnected IC. Whether a single or multichip module results depends, e.g., on the dicing operation at the end of the process. If the panel or wafer is cut so that more than one chip is included in a module then an MCM is produced.

Figure 2C:
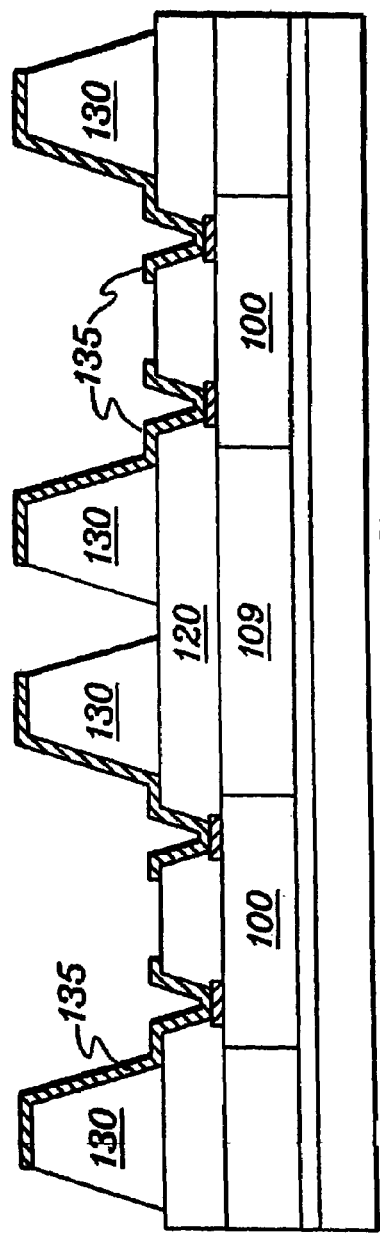
FIG. 2C is a cross-sectional elevational view of the structure of FIG. 2B after formation of compliant polymer bumps and patterning thereof with metallization in accordance with the principles of the present invention.
Figure 4E:
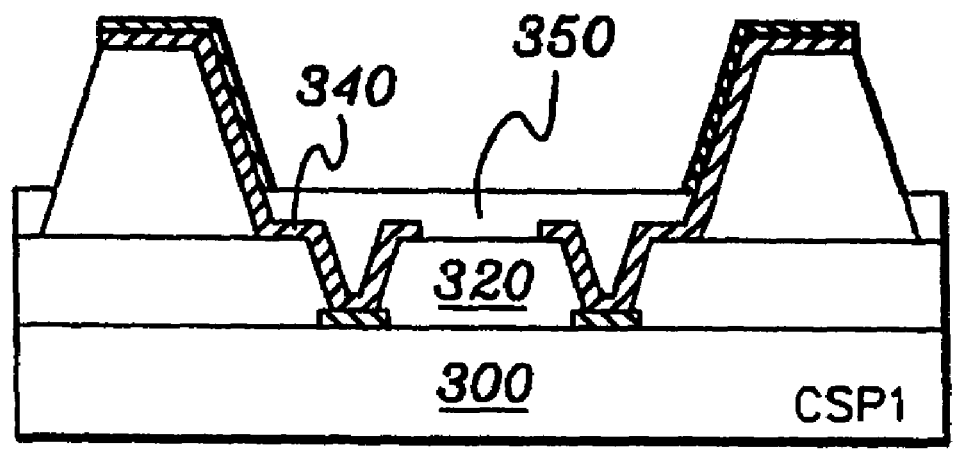
FIG. 4E is a cross-sectional elevational view of a chip scale package (CSP) singulated from the structure of FIG. 4D in accordance with the principles of the present invention.

FIGS. 2A–2E show one embodiment of the process flow for fabrication of a compliant polymer bump structure in accordance with the principles of the present invention. FIG. 2A is the starting point. Two IC chips 100 with bond pads 110 are shown adhesively mounted 107 on a process carrier 105 and surrounded by filler 109. The fabrication of a panel containing IC chips surrounded by filler is described in U.S. Pat. No. 5,841,193, entitled "Single Chip Modules, Repairable Multi Chip Modules, and Methods of Fabrication Thereof," Issued Nov. 24, 1998, the entirety of which is hereby incorporated herein by reference. However, any method which provides such a panel can be the starting point for the subject invention. FIGS. 4A–4E show similar processing steps except that processing is carried out directly on a wafer. The essential difference is that the steps required to form an array of chips surrounded by filler and mounted on a process carrier are eliminated. For wafer processing FIG. 4A is the starting point. A section of the wafer 300 which contains two IC chips with bond pads 310 is shown. A dotted line shows how the wafer could be sawn to produce two Chip Scale Packages (CSPs), labeled CSP1 and CSP2.

According to the present invention, a compliant layer of polymer dielectric is sprayed on the top surface of the panel or wafer and soft baked. Characteristics of a preferred low modulus high elongation dielectric are described in the above-incorporated, co-filed and commonly assigned U.S. patent application entitled "Integrated Circuit Structures and Methods Employing a Low Modulus High Elongation Photodielectric." This co-filed application details a polymer which has sufficiently low modulus and sufficiently high elongation and which has the other properties necessary for via formation and metallization. In addition, this application also details appropriate primer layers and methods of application. The primer layers increase adhesion and improve performance in environmental testing. The compliant layer is preferably sprayed to a thickness of 40 to 60 microns. The polymer is soft baked 30 minutes at 95 C. Vias of 60 micron diameter are photo patterned in this layer by exposing it to a total energy of 25 mJ/cm$^2$ at 365 nM. Next the dielectric is developed in a dip developer for 1:20 minutes using a 1 part to 2 part mixture of Proplyene glycol methyl ether in propanol. The dielectric is UV flooded with an energy of 4 Joule. A 30% $CF_4/O_2$ plasma of 400W in an LFE 1000 barrel etcher for 10 minutes is used to enlarge the via holes, remove polymer residue from the base of the via hole and texture the surface for improved adhesion of the metallization to the polymer surface. FIG. 2B shows the compliant dielectric 120 applied to the top surface of the panel with via holes 125 formed in the dielectric down to pads 110 of the IC chips 100. FIG. 4B shows the compliant dielectric 320 applied and patterned with via holes 325 to the IC pads 310 on wafer 300.

Next, a compliant dielectric, such as the same polymer, is sprayed to a thickness of, for example, 100 microns. The polymer is soft baked 30 minutes at 95 C. 200 micron bumps can be exposed by exposing the structure to a total energy of 125 mJ. This is followed by dielectric development for 3:00 minutes. The bumps are UV flooded with an energy of 4 Joule/cm$^2$ and then post baked at 150 C for 30 minutes. Plasma is used to texture the polymer surface to promote adhesion and remove any residual polymer from the via holes. A 30% $CF_4/O_2$ plasma of 400W in an LFE 1000 barrel etcher for 15 minutes is used. FIGS. 2C & 4C depict the resultant polymer bumps 130 & 330, respectively.

A seed layer of cooper metallization is next applied to the polymer surface and in the via holes making connection to the underlying circuit pads. The presently preferred technique for copper seed metallization employs catalyzation and electroless copper metallization techniques. The above-incorporated, co-filed and commonly assigned U.S. patent application entitled "Electroless Metal Connection Structures and Methods" details one process for electroless metallization of IC bond pads. Additionally, U.S. Pat. No. 5,841,193, details sputter metallization techniques for direct connection to IC bond pads. This seed layer is covered with electro deposited resist available from Shipley Corporation of Newton, Mass. The resist is patterned to form conductors from the via holes to the tops of the compliant bumps. The metallization preferably covers the entire tops of the compliant bumps, but only a relatively thin line is formed from the top of the bump to the surface of the dielectric. This facilitates ease of displacement of the bumps by not having a thick layer of copper over all of the compliant bump surface. The metal is then pattern plated to a thickness of, e.g., 10 microns. This is followed by stripping of the resist by plasma etching in a 30% $CF_4/O_2$ plasma and stripping of the seed copper layer in Ammonium Persulfate. FIGS. 2C and 4C show the completed compliant polymer bumps 130 & 330 with patterned metallization 135 & 340, respectively. Note that only one metallization and patterning step is required to form both the Metal 1 interconnect and the metallization pattern on the bumps.

A self-patterning solder mask layer is formed by spraying the compliant polymer to a thickness of 40 microns, soft baking at 95 C for 30 minutes and UV flooding at 4 Joules/cm$^2$. A bake of 1 hour at 150 C follows. This mask layer tends to flow off the top of the bumps and also fills in the via holes and partially covers the conductor layer. To be sure that the polymer is off the metal on tops of the bumps, a plasma etch in $CF_4/O_2$ at 400W for 20 minutes can be conducted. Note that the solder mask completely surrounds the base of each bump providing the solder masking feature as well as providing distribution and leveling of stresses on the bumps. The process is completely self-aligning to the bumps and does not require a photo masking step.

Figure 2D:
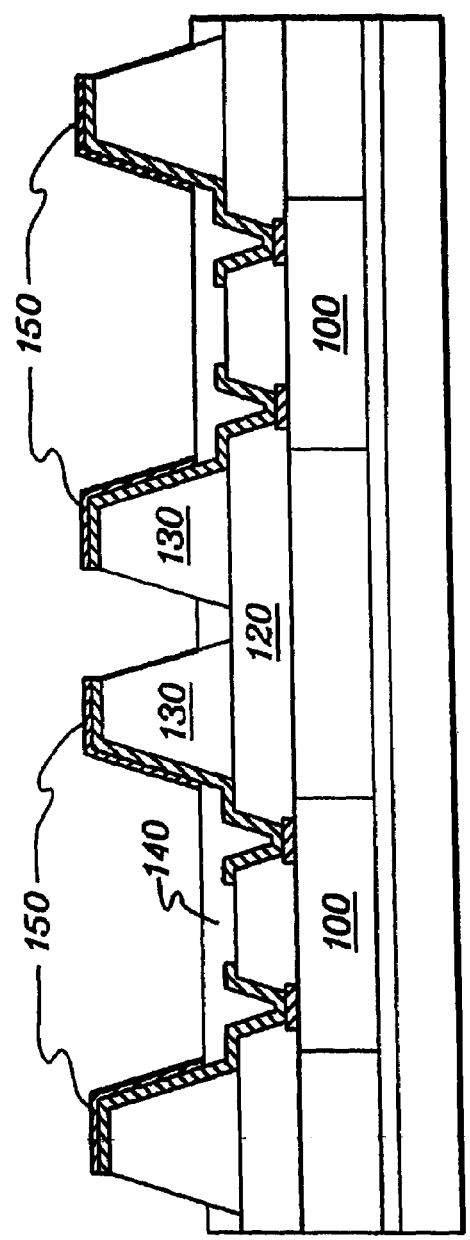
FIG. 2D is a cross-sectional elevational view of the structure of FIG. 2C after application of a self-patterning solder mask and the formation of a solderable finish on exposed portions of metallization on the compliant polymer bumps in accordance with the principles of the present invention.

To enhance and preserve solderability, an electroless layer of nickel followed by immersion gold is preferably applied to the exposed copper of the bumps. The copper is first etched in ammonium persulfate to remove oxide and then, e.g., the Ronamax nickel gold finishing process available from Lea Ronal of Freeport, N.Y. is applied. FIGS. 2D and 4D show the completed panel with solder masks 140, 350 and selectively applied solderable nickel/gold finishes 150, 360, respectively.

Figure 2E:
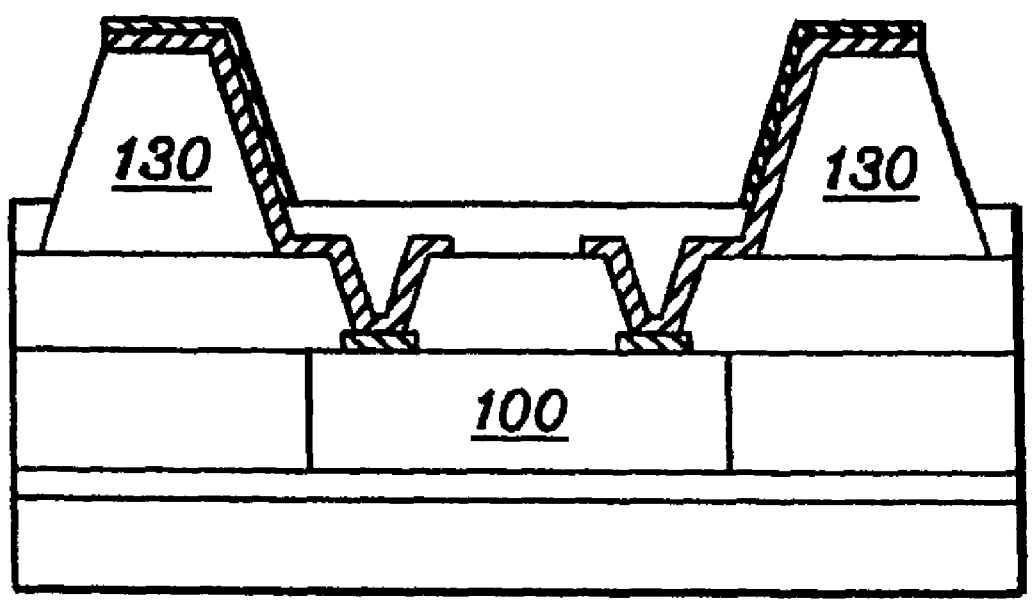
FIG. 2E is a cross-sectional elevational view of a chip scale package formed from singulation of the structure of FIG. 2D in accordance with the principles of the present invention.

A CSP module can be completed by sawing the panel (FIG. 2D) or wafer (FIG. 4D) into single modules. The operation of dicing a panel or wafer is well known in the art. For example, singulation can be done using a Disco 320 saw available from Disco Corporation of Tokyo, Japan. FIG. 2E and FIG. 4E show the completed singulated module 160 and 370 sawn from the process panel or wafer, respectively. Note that while one IC chip is shown here producing a Chip Scale Package (CSP), the panel or wafer could have been sawn to form multiple chip modules (MCMs) which enjoy the same advantages of the compliant bump structure described above.

Figure 6A:
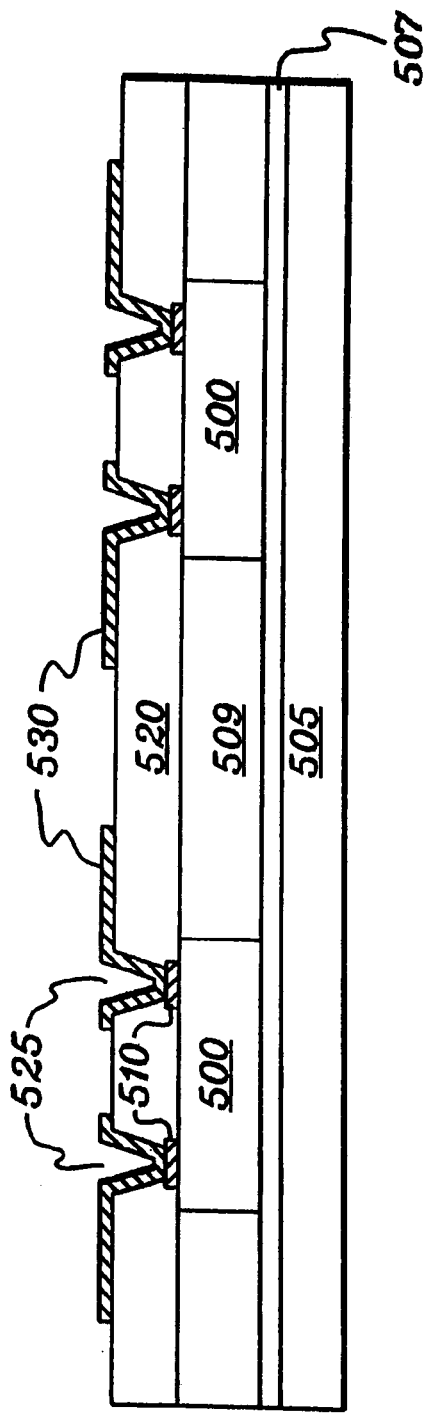
FIG. 6A is a cross-sectional elevational view of one embodiment of panel of singulated integrated circuit (IC) chips surrounded by filler mounted on a substrate and having a dielectric layer disposed thereover and a first metal layer disposed on the dielectric layer in accordance with the principles of the present invention.

FIGS. 6A–6E show one embodiment of a process flow for fabrication of a multilayer structure with the compliant polymer bump in accordance with the principles of the present invention. FIG. 6A is the starting point. Two IC chips 500 with bond pads 510 are shown adhesively mounted 507 on a process carrier 505 and surrounded by filler 509. A first dielectric layer 520 is applied to the top of the IC chips and filler material and vias 525 are formed in the dielectric down to the bond pads 510 of the ICs. Metallization 530 is applied and patterned to form the interconnect patterns. This process is as described above. Any method which provides connection to the IC chips and which results in patterned metal which can be contacted by a subsequent metal layer can be the starting point for this aspect of the subject invention. It is preferred but not required that dielectric layer 520 be formed from compliant dielectric since this increases the total compliance of the structure.

Figure 10A:
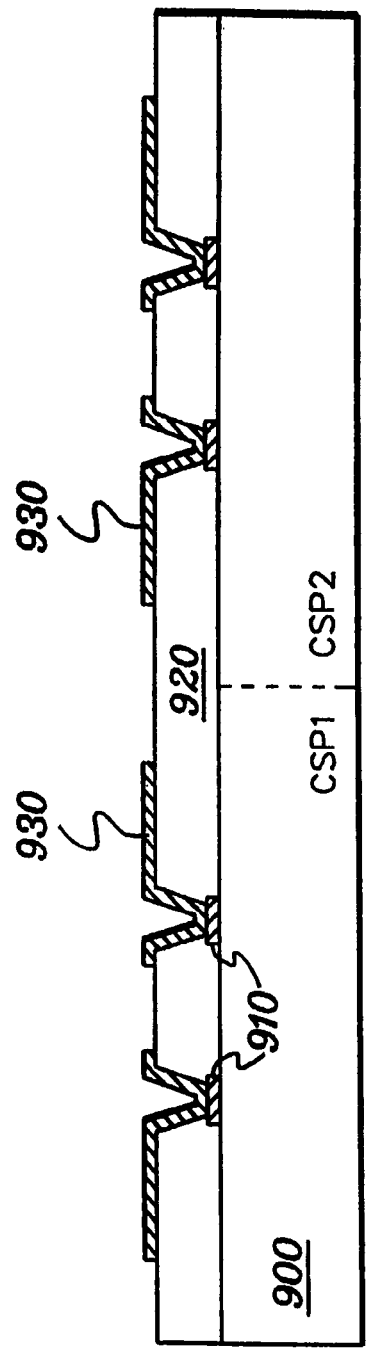
FIG. 10A is a cross-sectional elevational view of one embodiment of a wafer with two integrated circuit chips defined therein and dielectric applied to an upper surface thereof and provided with via openings to bond pads on the wafer, with patterned metallization thereon to electrically connect through the vias to the bond pads in accordance with the principles of the present invention.
Figure 10B:
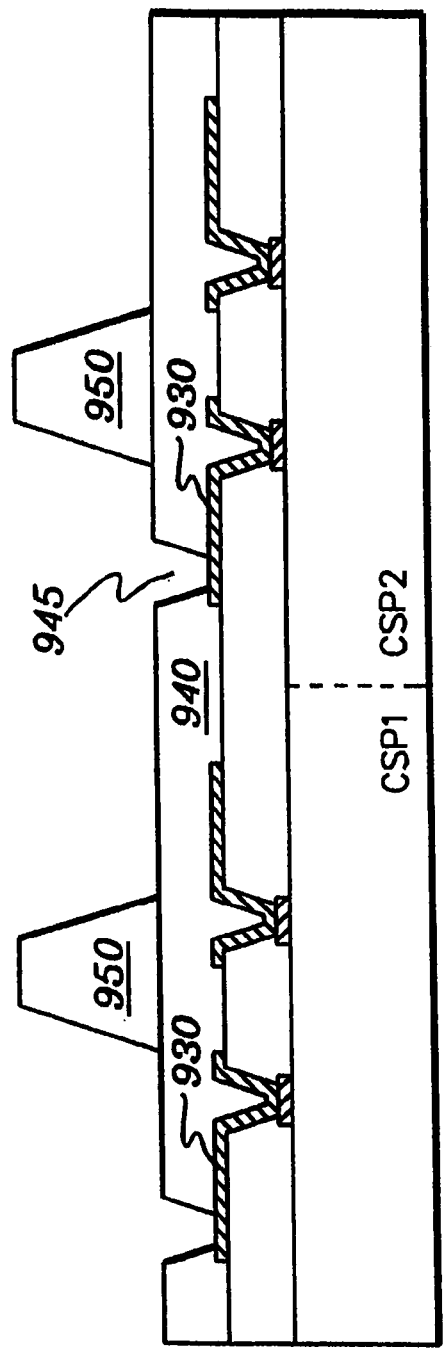
FIG. 10B is a cross-sectional elevational view of the structure of FIG. 10A after spraying of a second dielectric layer and patterning thereof with via openings, to expose selected portions of the metal 1 layer and after formation of compliant polymer bumps in accordance with the principles of the present invention.
Figure 10C:
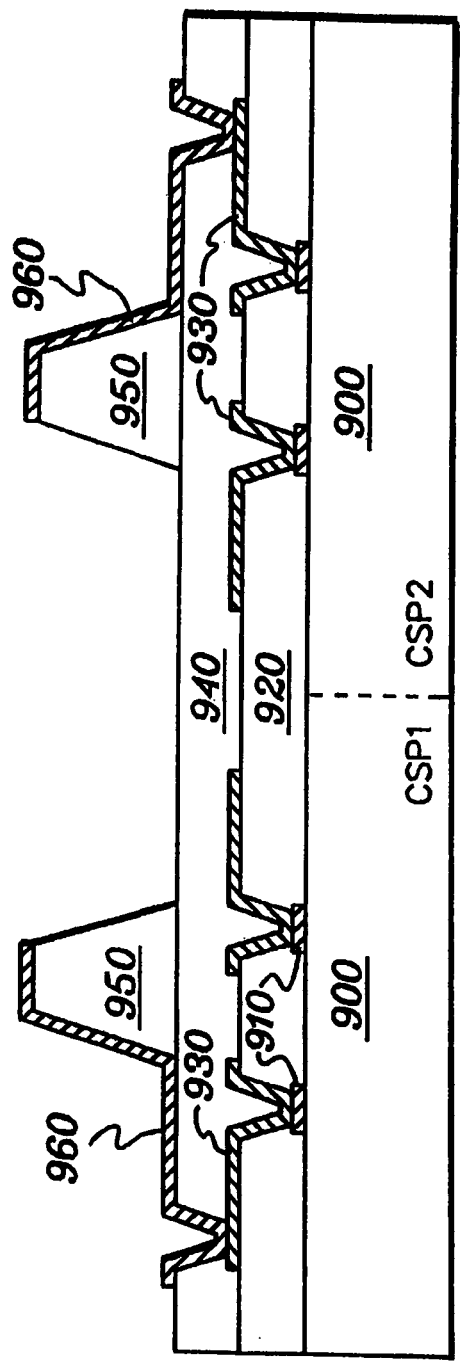
FIG. 10C is a cross-sectional elevational view of the structure of FIG. 10B after application of a second metal layer and patterning thereof to make connections in the via openings of the second dielectric layer and to cover the top portions of the compliant bumps in accordance with the principles of the present invention.
Figure 10D:
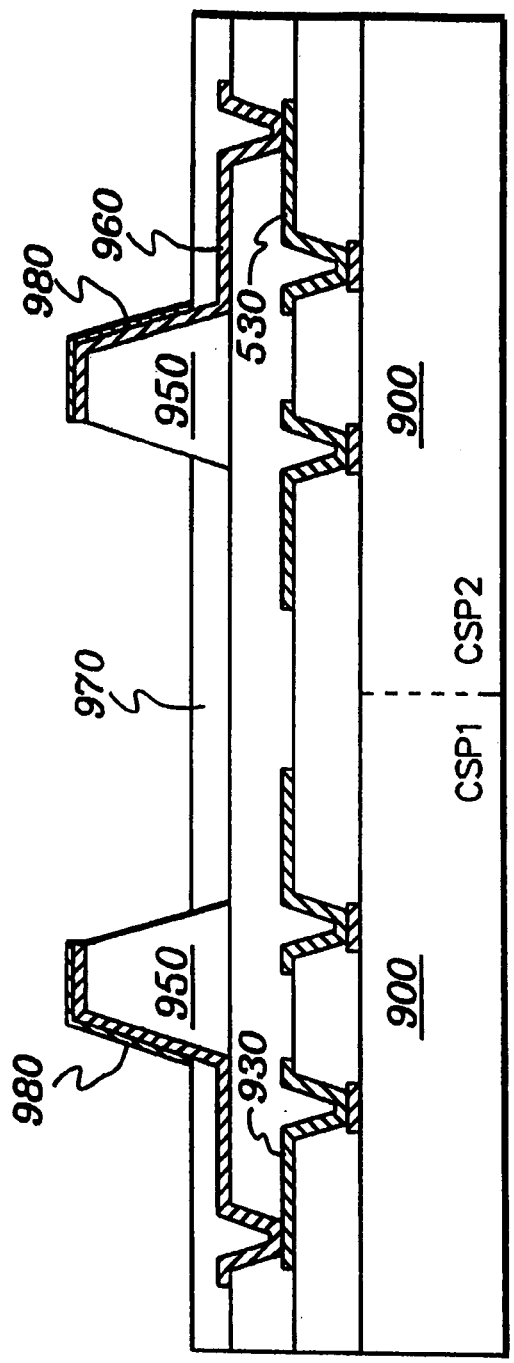
FIG. 10D is a cross-sectional elevational view of the structure of FIG. 10C after application of a self-patterning solder mask and formation of a solderable finish on exposed metallization on the polymer bumps in accordance with the principles of the present invention.
Figure 11:
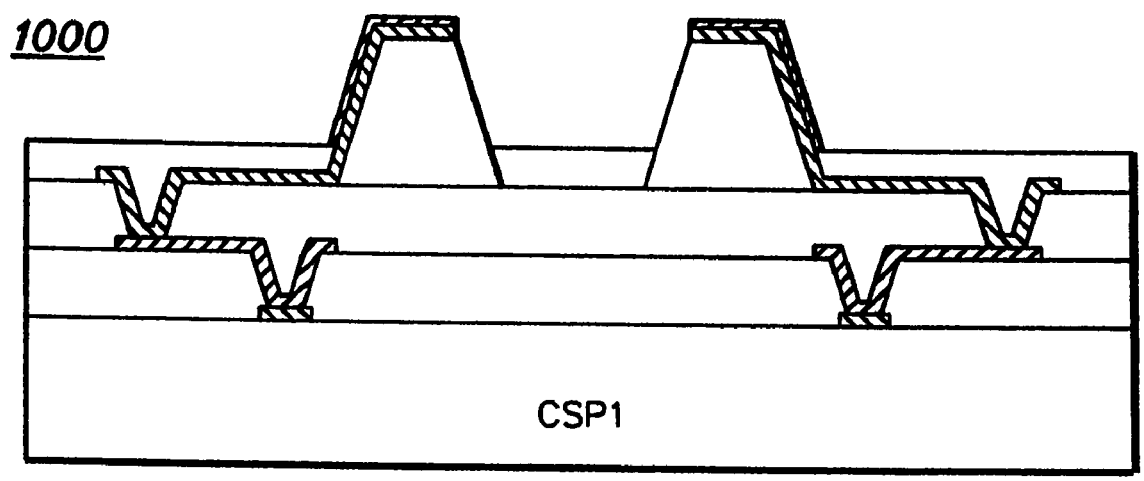
FIG. 11 is a cross-sectional elevational view of a chip scale package (CSP) formed, e.g., from singulation of the structure of FIG. 10D in accordance with the principles of the present invention.

FIGS. 10A–11 depict the same processing steps except that processing is carried out directly on a wafer 900. The essential difference is that the steps required to form an array of chips surrounded by filler and mounted on a process carrier are eliminated. For wafer processing FIG. 10A is the starting point. A section of the wafer 900 which contains two IC chips is shown. A dotted line shows how the wafer would be sawn to produce two Chip Scale Packages (CSPs) labeled CSP1 and CSP2. A first dielectric layer 920 is applied to the top of the IC chips and vias are formed in the dielectric down to the bond pads 910 of the CSPs. Metallization 930 is applied and patterned to form the interconnect patterns. This process is again as described above.

According to the principles of the present invention, a compliant layer of polymer can be sprayed on the first layer dielectric and soft baked. The above-incorporated, co-filed U.S. patent application entitled "Integrated Circuit Structures and Methods Employing a Low Modulus High Elongation Photodielectric" details a polymer which has sufficiently low modulus and sufficiently high elongation and which has the other properties necessary for via formation and metallization. In addition, this above-incorporated application also details appropriate primer layers and methods of application. The primer layers increase adhesion and improve performance in environmental testing. This compliant second layer dielectric is preferably sprayed to a thickness of 40–60 microns. The polymer is soft baked 30 minutes at 95 C. Vias of 60 micron diameter can be photo patterned in this layer by exposing it to a total energy of 25 mJ/cm$^2$ at 365 nM. The dielectric is developed in a dip developer for 1:20 minutes using a 1 part to 2 part mixture of Proplyene glycol methyl ether in propanol. The dielectric is UV flooded with an energy of 4 Joule/cm$^2$. A 30% $CF_4/O_2$ plasma of 400W in an LFE 1000 barrel etcher for 10 minutes is used to enlarge the via holes, remove polymer residue from the base of the via holes and texture the surface for improved adhesion of the metallization to the polymer surface.

Figure 6B:
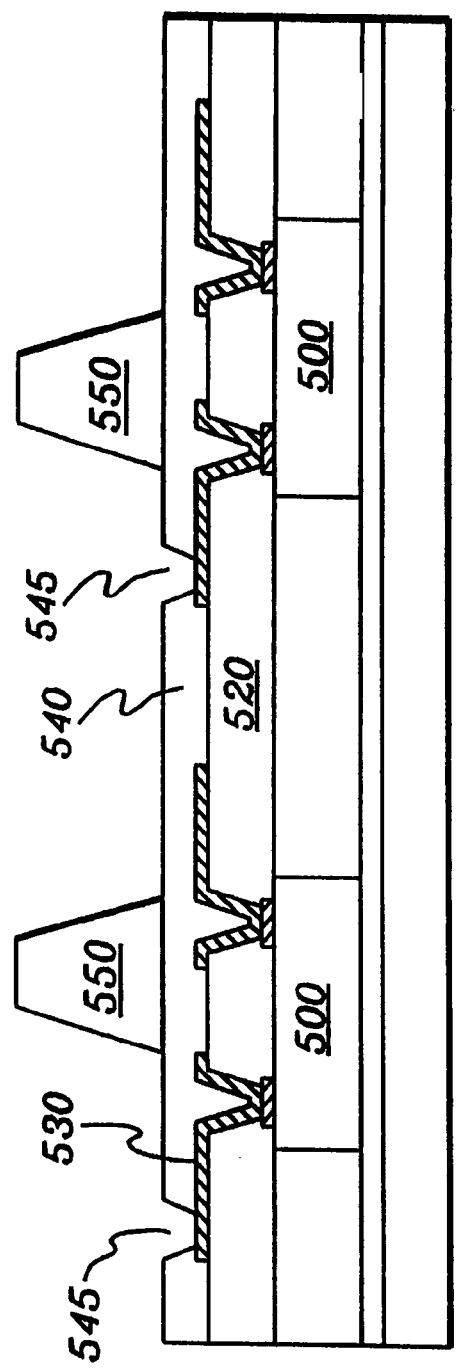
FIG. 6B is a cross-sectional elevational view of the structure of FIG. 6A after application of a second dielectric layer and patterning thereof with via holes, and after formation of compliant polymer bumps above the second dielectric layer in accordance with the principles of the present invention.

Next, the same polymer can be sprayed to a thickness of, e.g., 100 microns. The polymer is soft baked 30 minutes at 95 C. 200 micron bumps are then exposed by exposing the structure to a total energy of 125 mJ. This is followed by dielectric development for 3:00 minutes. The bumps are UV flooded with an energy of 4 Joules/cm$^2$ and then post baked at 150 C for 30 minutes. Plasma is used to texture the polymer surface to promote adhesion and remove any residual polymer from the via hole. A 30% $CF_4/O_2$ plasma of 400W in an LFE 1000 barrel etcher for 15 minutes can be used. The resulting structures are shown in FIGS. 6B and 10B for panel and direct wafer processing, respectively. In FIG. 6B, the second layer dielectric 540 is shown patterned with via openings 545 to expose selected portions of metal 1 layer 530. The compliant polymer bumps 550 are each positioned near a respective via opening 545. In FIG. 10B, the second layer dielectric 940 is shown patterned with via openings 945 which again expose selected portions of first metal layer 930. The compliant polymer bumps 950 are positioned as desired, for example, adjacent to a respective via opening 945 in second layer dielectric 940.

Figure 6C:
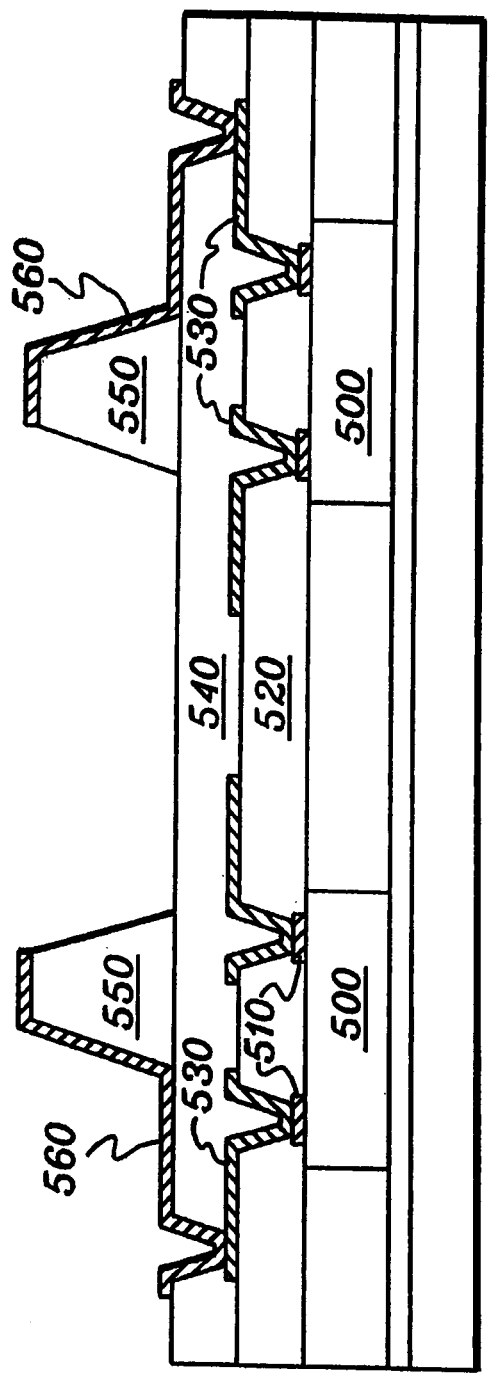
FIG. 6C is a cross-sectional elevational view of the structure of FIG. 6B after a second metal layer has been applied and patterned to make connection in the via openings of the second dielectric layer and to cover the top of the compliant bumps in accordance with the principles of the present invention.

A seed layer of copper metallization is next applied by using catalyzation and electroless copper metallization techniques; which are well known in the printed circuit industry. This seed layer is covered with electro deposited resist available, e.g., from Shipley Corporation of Newton, Mass. The resist is patterned to form conductors from the via holes to the tops of the compliant bumps. The metallization preferably covers the entire tops of the compliant bumps, but only a relatively thin line (or lines) is formed from the top of each bump to the surface of the second layer dielectric. This facilitates the ease of displacement of the bumps by not having a thick layer of copper over all of the compliant bump surfaces. The metal is then pattern plated to a thickness of, e.g., 10 microns. This is followed by stripping of the resist by plasma and etching of the seed copper layer in Ammonium Persulfate. FIGS. 6C and 10C show the completed compliant polymer bumps with attached metallization. Note that only one metallization and patterning step is required to form both the metal 2 interconnect and the metallization pattern of the bumps. In FIG. 6C, the metal 2 interconnect 560 is shown to electrically couple the top surface of each compliant bumps 550 to the metal 1 interconnect 530 through the via openings in the second dielectric layer 540. In FIG. 10C, metal 2 interconnect 960 connects the upper surfaces of compliant bumps 950 with metal 1 layer 930 through the via openings formed in the second layer dielectric.

A solder mask layer is next formed by spraying the compliant polymer layer to a thickness of 40 microns, soft baking at 95 C for 30 minutes and UV flooding at 4 Joules/cm$^2$. A bake of 1 hour at 150 C follows. This layer is self-patterning in that it tends to flow off the tops of the bumps, fill in the via holes, and cover portions of the metal 1 layer. To be sure that the polymer is off the metal on top of the bumps, a plasma etch in $CF_4/O_2$ at 400W in an LFE 1000 barrel etcher for 20 minutes can be conducted. Note that the resultant solder mask completely surrounds the base of each bump providing the solder masking feature as well as providing distribution and leveling of stresses on the bumps. The process is completely self-aligning to the bumps and does not require a photo masking step.

Figure 6D:
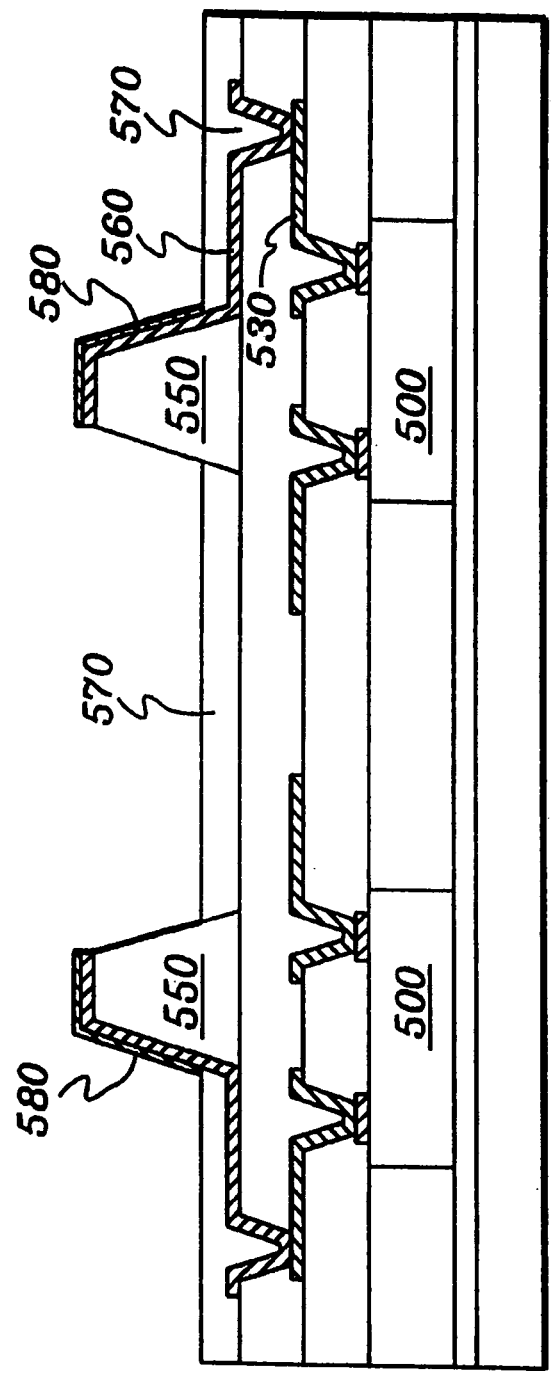
FIG. 6D is a cross-sectional elevational view of the structure of FIG. 6C showing application of a self-patterning mask and a solderable finish to exposed portions of the metal 2 layer on the compliant bumps in accordance with the principles of the present invention.

To enhance and preserve solderability, an electroless layer of nickel followed by immersion gold is preferably applied to the exposed copper of the bumps. The copper is first etched in ammonium persulfate to remove oxide and then, e.g., the Ronamax nickel gold finishing process available from Lea Ronal of Freeport, N.Y. can be applied. FIGS. 6D and 10D show the completed panel with solder mask 570, 970 and selectively applied solderable nickel/gold finishes 580, 980, respectively.

Figure 7:
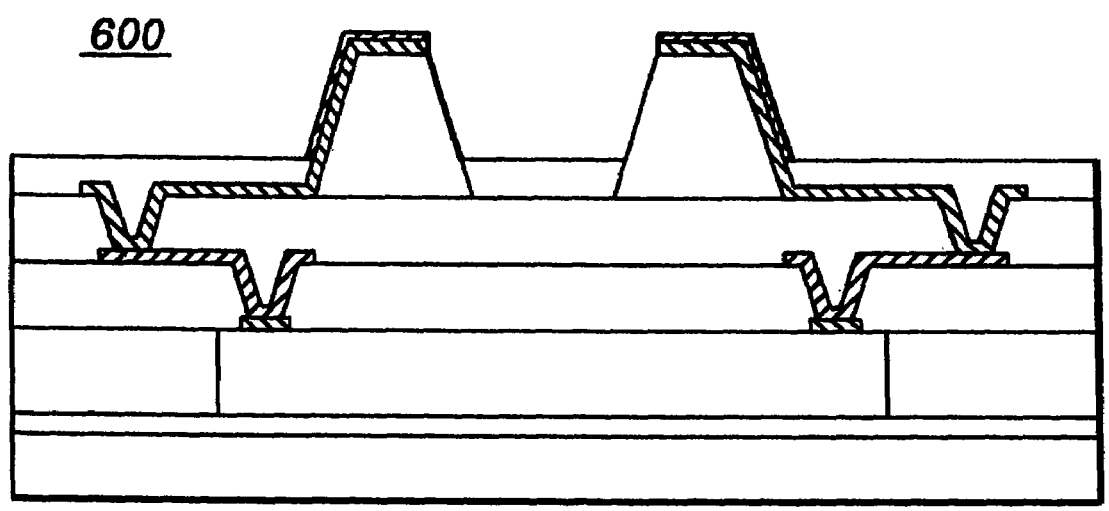
FIG. 7 is a cross-sectional elevational view of a structure such as depicted in FIG. 6D after singulation of packaged integrated circuit chips in accordance with the principles of the present invention.

A CSP module can be completed by sawing the panel or wafer into single modules. The operation of dicing a panel or wafer is well known in the art. For example, singulation can be done using a Disco 320 available from Disco Corporation of Tokyo, Japan. FIG. 6D might comprise a multilayer chip scale package (CSP) sawn from a panel, while FIG. 7 shows a multilayer multichip module 600 sawn from a panel. FIG. 11 shows a completed multilayer chip scale package (CSP) module 1000 singulated from a wafer. Note that MCMs enjoy the same advantages of the compliant bump structure as do CSPs. Note also that while the process has been described in terms of 2 metal layers, multiple dielectric and metal layers can be provided by repeating the steps described.

Figure 3F:
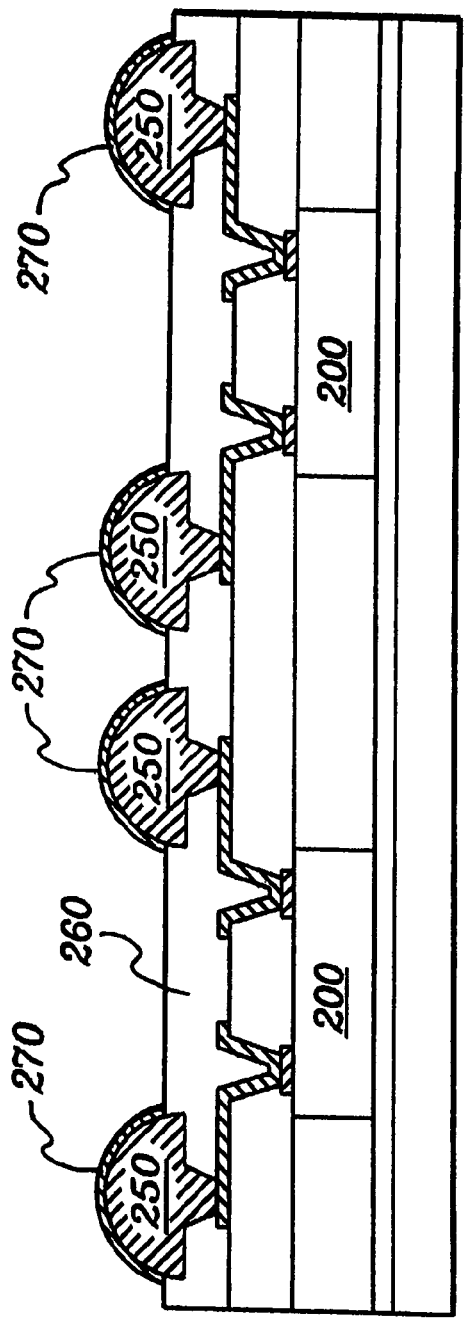
FIG. 3F is a cross-sectional elevational view of the structure of FIG. 3E after a self-patterning solder mask has been applied, and a solderable finish formed over the exposed surfaces of the conductive mushroom-shaped bumps in accordance with the principles of the present invention.
Figure 5D:
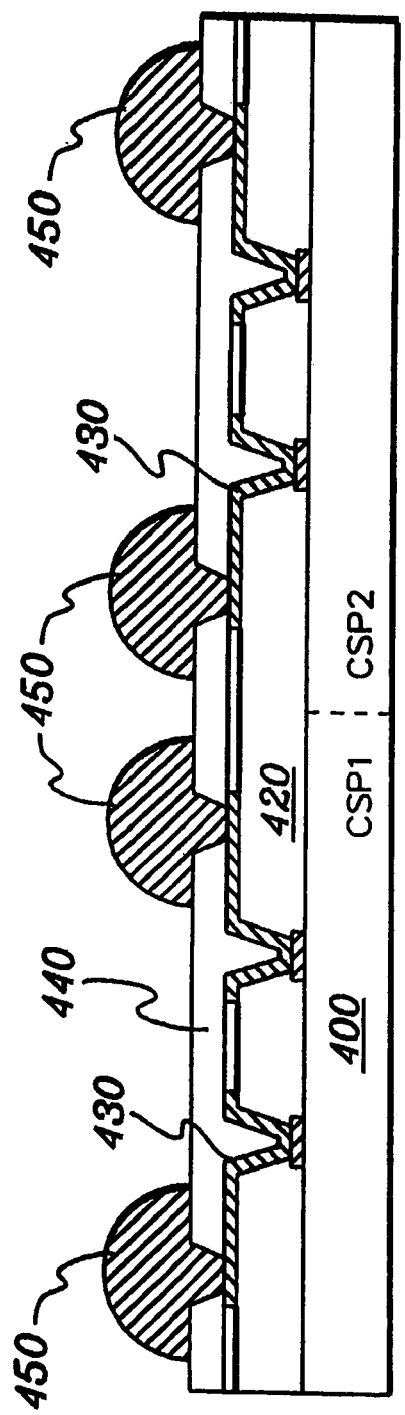
FIG. 5D is a cross-sectional elevational view of the structure of FIG. 5C after plating of solid conductive bumps from exposed portions of the metal layer in accordance with the principles of the present invention.

FIGS. 3A–3G show the process flow for fabrication of a solid copper bump over compliant dielectric structure in accordance with another aspect of the present invention. FIG. 3A is the assumed starting point. Two IC chips 200 with bond pads 210 are shown adhesively mounted 207 on a process carrier 205 and surrounded by filler 209. Again, the fabrication of a panel containing IC chips surrounded by filler is described in U.S. Pat. No. 5,841,193, entitled "Single Chip Modules, Repairable Multi Chip Modules, and Methods of Fabrication Thereof," Issued Nov. 24, 1998. However, any method which provides such a panel can be the starting point for the subject invention. FIGS. 5A–5G show the same processing steps except that processing is carried out directly on a wafer 400. The essential difference is that the steps required to form an array of chips surrounded by filler and mounted on a process carrier are eliminated. For wafer processing FIG. 5A is the assumed starting point. A section of the wafer 400 which contains two IC chips with bond pads 410 is shown. A dotted line shows how the wafer would be sawn to produce two Chip Scale Packages (CSPs) labeled CSP1 and CSP2.

According to this aspect of the present invention, a compliant layer of polymer (dielectric 1) is sprayed on the surface of the panel or wafer and soft baked. The compliant layer is preferably sprayed to a thickness of 40–60 microns. The polymer is soft baked 30 minutes at 95 C. Vias of 60 micron diameter can be photo patterned in this layer by exposing it to a total energy of 25 mJ/cm$^2$ at 365 nM. The dielectric is developed in a dip developer for 1:20 minutes using a 1 part to 2 part mixture of Proplyene glycol methyl ether in propanol. The dielectric is UV flooded with an energy of 4 Joule/cm$^2$. A 30% $CF_4/O_2$ plasma of 400W in an LFE 1000 barrel etcher for 15 minutes is used to enlarge the via holes, remove polymer residue from the base of the via holes and texture the surface for improved adhesion of the subsequent metallization to the polymer surface.

Next, a seed layer of copper metallization is applied to the polymer surface and in all the via holes making connection to the underlying circuit pads. One technique for copper seed metallization uses catalyzation and electroless copper metallization. The above-incorporated, co-filed patent application entitled "Electroless Metal Connection Structures and Methods," details one process for electroless metallization of IC bond pads. Additionally, U.S. Pat. No. 5,841,193, details sputter metallization techniques for connection to IC bond pads. This seed layer is covered with an electro deposited resist available, e.g., from Shipley Corporation of Newton, Mass. The resist is patterned to form conductors from the via holes over the surface of dielectric 1. The metallization preferably forms a large circle to form the base of each bump. The metal is then pattern plated to a thickness of, e.g., 10 microns. FIGS. 3B and 5B respectively show the resultant compliant dielectric 220, 420 with via holes 225, 425, seed copper applied 227, 427, electro deposited resist 229, 429 applied and patterned and metal 1 layer 230, 430 plated up as defined by the resist. In a next step in the process, the electro deposited resist 229, 429 is made resistant to subsequent application of solvents by UV flooding with 4 Joules per square cm at 365 nM. This is followed by spray application of a positive resist type AZP 4620 available from Clariant of Sunnyvale, Calif. The resist is preferably coated to a thickness of 25 to 50 microns. This resist is patterned to form small holes in the center of metal 1 bump land circles. Everything else is covered with resist. The holes are preferably 75 micron in diameter. FIGS. 3C and 5C show the positive resist 240, 440 with patterned holes 245, 445. Bumps are formed by electroplating until a bump of 100 microns height is formed. As the bump plates it grows both up and out once the copper is above the resist. This forms a mushroom shape with a stem as depicted in FIGS. 3D and 5D. In FIG. 3D, the resultant mushroom-shaped interconnect bumps 250 are shown to electrically connect to metal 1 layer 230, while in FIG. 3D, the resultant mushroom-shaped interconnect bumps 450 are shown to electrically connect to first metal layer 430. The mushroom shape is advantageous because of the combination of sections that make up the bump. The base of the bump is a large circle of copper that provides good adhesion to the top surface of dielectric 1. The top of the bump is the appropriate diameter for soldering to a circuit board. The metal stem between the base of the bump and the top portion of the bump is relatively small in diameter and thereby adds flexibility to the bump structure. This allows the bump to be displaced in lateral dimension and angle without placing undue stress on the structure or the solder joint formed between the bump and the circuit board.

Figure 5E:
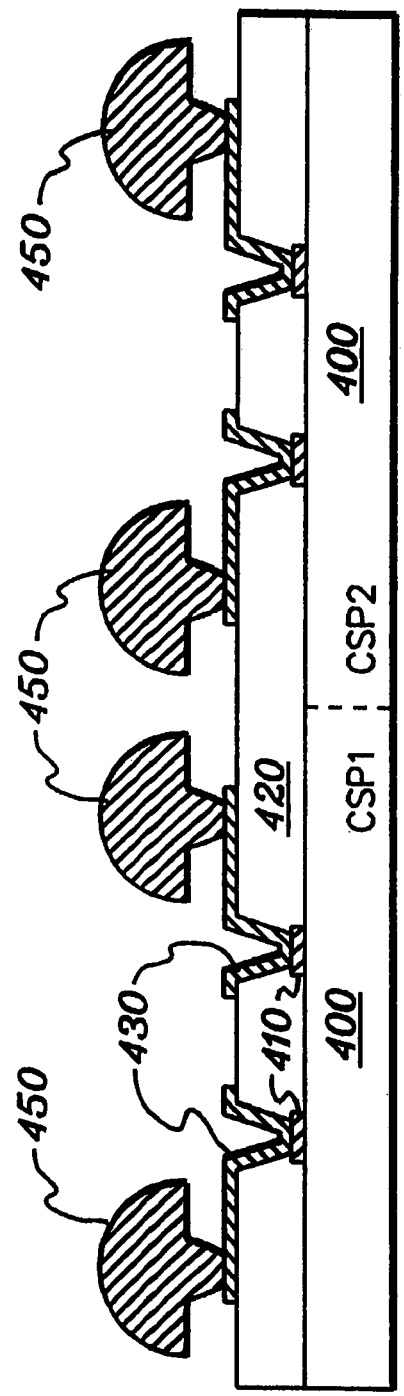
FIG. 5E is a cross-sectional elevational view of the structure of FIG. 5D after removal of the positive resist, electro-deposited resist, and seed metal layer disposed below the electro-deposited resist in accordance with the principles of the present invention.

The positive resist is next stripped in a 1 part to 2 part solution of Propylene glycol methyl ether in Propanol. A 3:00 minute soak with continuous agitation has been found to be satisfactory. This is followed by stripping of the electro deposited resist in a 25%/75% $CF_4/O_2$ plasma and etching of the seed copper layer in Ammonium Persulfate. FIGS. 3E and 5E show the solid copper bump structures with the positive and electro deposited resist removed, as well as the seed copper layer outside the metal 1 layer removed.

Figure 5F:
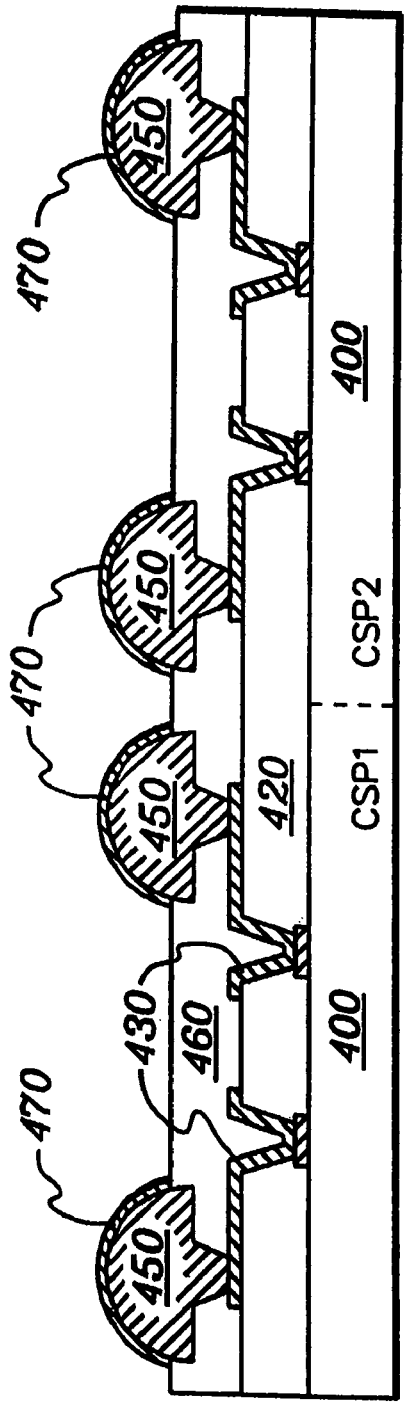
FIG. 5F is a cross-sectional elevational view of the structure of FIG. 5E showing application of a self-patterning solder mask and formation of a solderable finish on exposed portions of the conductive bumps in accordance with the principles of the present invention.

A self-patterning solder mask is formed by spraying the compliant polymer layer to a thickness of 40 microns, soft baking at 95 C for 30 minutes and UV flooding at 4 Joules/cm$^2$. A bake of 1 hour at 150 C follows. This layer tends to flow off the tops of the bumps, fills in the via holes and partially covers the top conductor layer as shown in FIGS. 3F & 5F. To be sure that the polymer is off the metal on top of the bumps a plasma etch in $CF_4/O_2$ at 400W in an LFE barrel etcher for 20 minutes can be conducted. Note that the solder mask completely surrounds the base of each bump providing the solder masking feature as well as providing distribution and leveling of stresses on the bumps. The process is completely self-aligning to the bumps and does not require a photo masking step.

To enhance and preserve solderability, an electroless layer of nickel followed by immersion gold can be applied to the exposed copper of the bumps. The copper is first etched in ammonium persulfate to remove oxide and then the Ronamax nickel gold finishing process available from Lea Ronal of Freeport, N.Y. is applied. FIGS. 3F and 5F show the completed panel with solder mask 260, 460 and selectively applied solderable nickel/gold finish 270, 470, respectively.

Figure 3G:
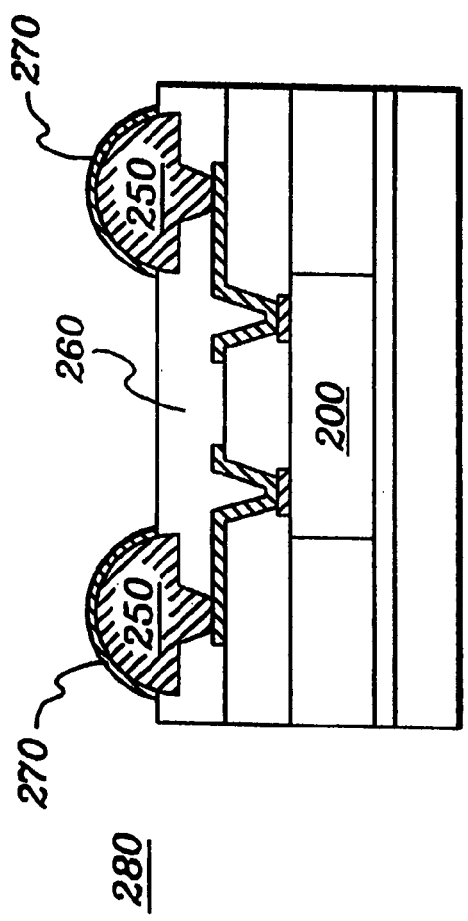
FIG. 3G is a cross-sectional elevational view of a completed chip scale package (CSP) module achieved from singulation of the structure of FIG. 3F in accordance with the principles of the present invention.
Figure 5G:
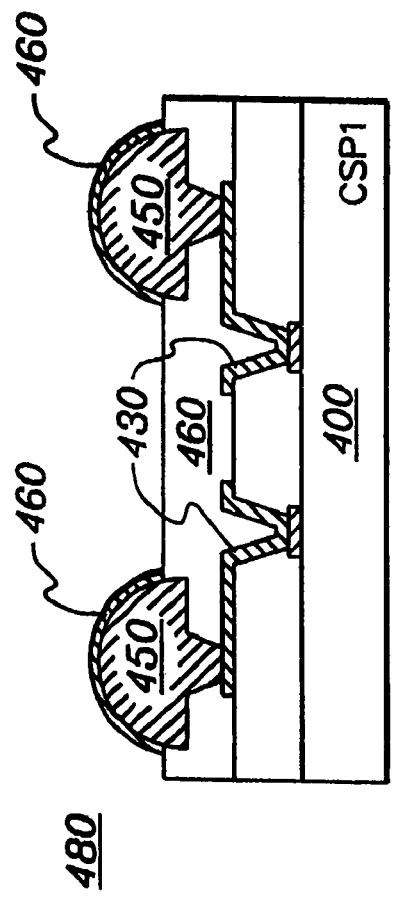
FIG. 5G is a cross-sectional elevational view of a chip scale package (CSP) singulated from the structure of FIG. 5F in accordance with the principles of the present invention.

A CSP module is completed by sawing the panel or wafer into single modules. The operation of dicing a panel or wafer is well known in the art. For example, singulation can be done using a Disco 320 available from Disco Corporation of Tokyo, Japan. FIGS. 3G and 5G show the completed singulated module 280, 480 sawn from the process panel or wafer, respectively. Note that while one IC chip is shown here producing a Chip Scale Package (CSP) the panel or wafer could have been sawn to form multiple chip modules MCMs which enjoy the same advantages of the compliant bump structures described herein.

Figure 8A:
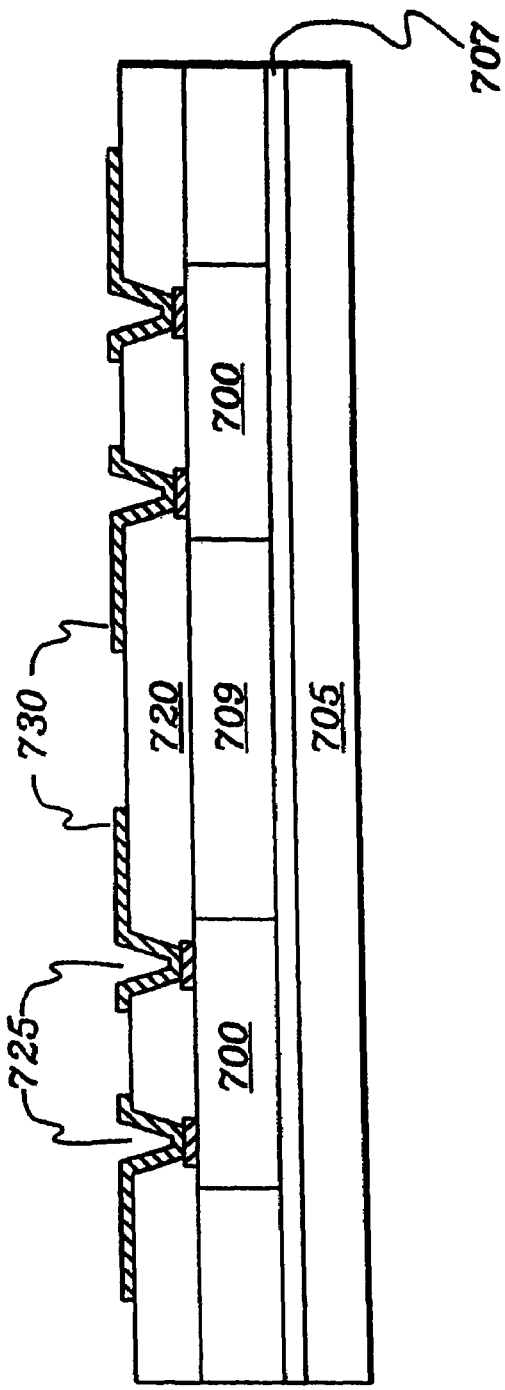
FIG. 8A is a cross-sectional elevational view of one embodiment of a panel of singulated integrated circuit (IC) chips surrounded by filler mounted on a substrate and having a patterned dielectric layer disposed thereon with a metal layer connecting to exposed bond pads of the IC chips in accordance with the principles of the present invention.

FIGS. 8A–8F & 9 show the process flow for fabrication of a multilayer solid copper bump over compliant dielectric structure in accordance with the present invention. FIG. 8A is assumed to be the starting point. Two IC chips 700 with bond pads 710 are shown adhesively 707 mounted on a process carrier 705 and surrounded by filler 709. Dielectric 720 is applied to the top of the IC chips and filler material and vias 725 are formed in the dielectric down to the bond pads 710 of the ICs. Metallization is applied and patterned to form the interconnect patterns 730. The process details to this point are described above. Any method which provides connection to the IC chips and which results in patterned metal which can be contacted by a subsequent metal layer can be the starting point for the subject invention.

Figure 12C:
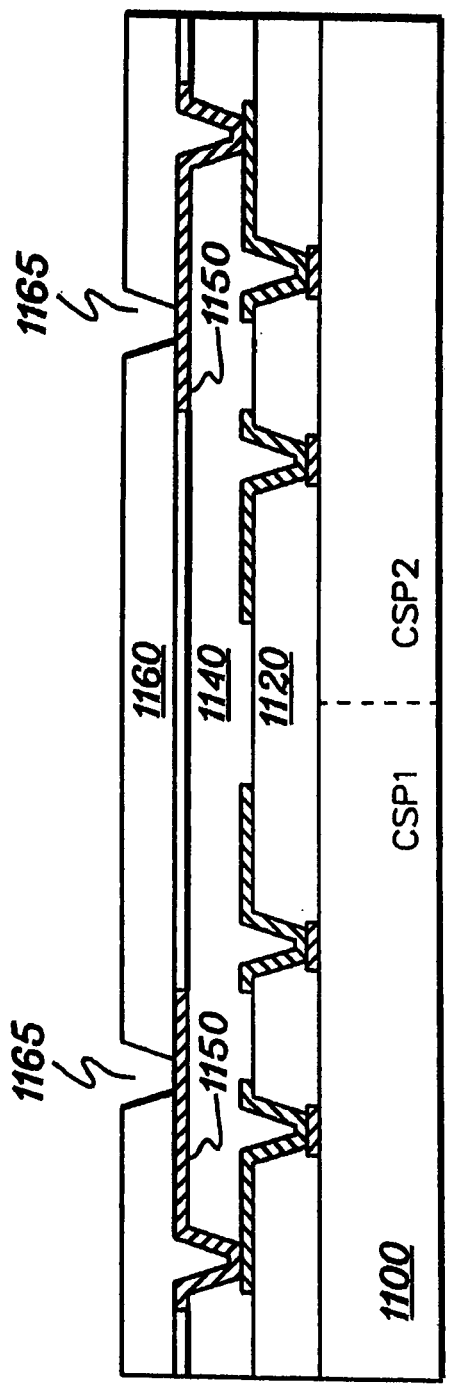
FIG. 12C is a cross-sectional elevational view of the structure of FIG. 12B after depositing of a positive resist and patterning thereof with via openings where conductive bumps are to be grown in accordance with the principles of the present invention.

FIGS. 12A–12F & 13 show the same processing steps outlined above except that processing is carried out directly on a wafer 1100. The essential difference is that the steps required to form an array of chips surrounded by filler and mounted on a process carrier are eliminated. For wafer processing FIG. 12A is the starting point. A section of the wafer 1100 which contains two IC chips is shown. A dotted line shows how the wafer would be sawn to produce two Chip Scale Packages (CSPs) labeled CSP1 and CSP2. The dielectric 1 1120 is deposited and patterned with via openings exposing bond pads 1110 as described above. A metal 1 layer 1130 is then formed extending into the via openings to electrically contact the bond pads as shown.

According to the present invention, a compliant layer of polymer is sprayed on the dielectric 1 layer and soft baked. The compliant layer is preferably sprayed to a thickness of approximately 40 microns. The polymer is soft baked 30 minutes at 95 C. Vias of 60 micron diameter are photo patterned in this layer by exposing the structure to a total energy of 25 mJ/cm$^2$ at 365 nM. The dielectric is developed in a dip developer for 1:20 minutes using a 1 part to 2 part mixture of Proplyene glycol methyl ether in propanol. The dielectric is UV flooded with an energy of 4 Joule/cm$^2$. A 30% $CF_4/O_2$ plasma of 400W in an LFE barrel etcher for 15 minutes is used to enlarge the via holes, remove polymer residue from the base of the via holes and texture the surface for improved adhesion of the metallization to the polymer surface.

Figure 8B:
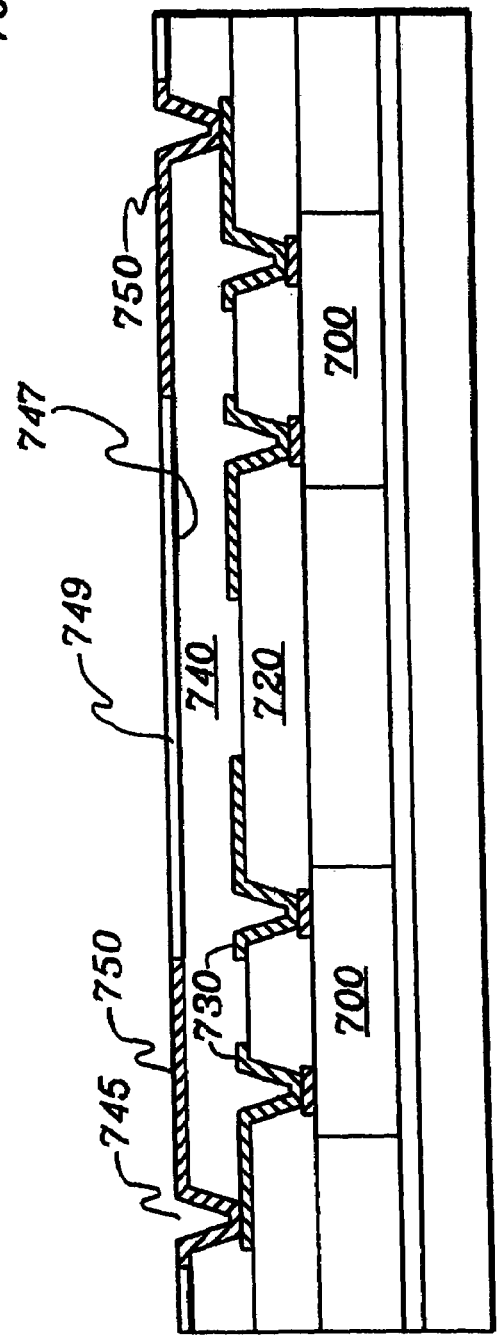
FIG. 8B is a cross-sectional elevational view of the structure of FIG. 8A after application of a second dielectric layer and patterning thereof with via holes, application of a seed metal layer, electro-depositing of a resist and patterning thereof, and plating up of a second metal layer in accordance with the principles of the present invention.

A seed layer of copper metallization is next applied by using catalyzation and electroless copper metallization techniques which are well known in the printed circuit industry. This seed layer is covered with electro deposited resist available, e.g., from Shipley Corporation of Newton, Mass. The resist is patterned to form conductors from the via holes to the surface of the compliant dielectric. The metallization preferably forms large circles to form the base of the bumps. The metal is then pattern plated to a thickness of, e.g., 10 microns. FIGS. 8B and 12B show compliant dielectric 740, 1140 with via holes 745, 1145, seed copper 747, 1147 applied, electro deposited resist 749, 1149 applied and patterned and metal 2 750, 1150 plated up as defined by the resist.

Figure 8C:
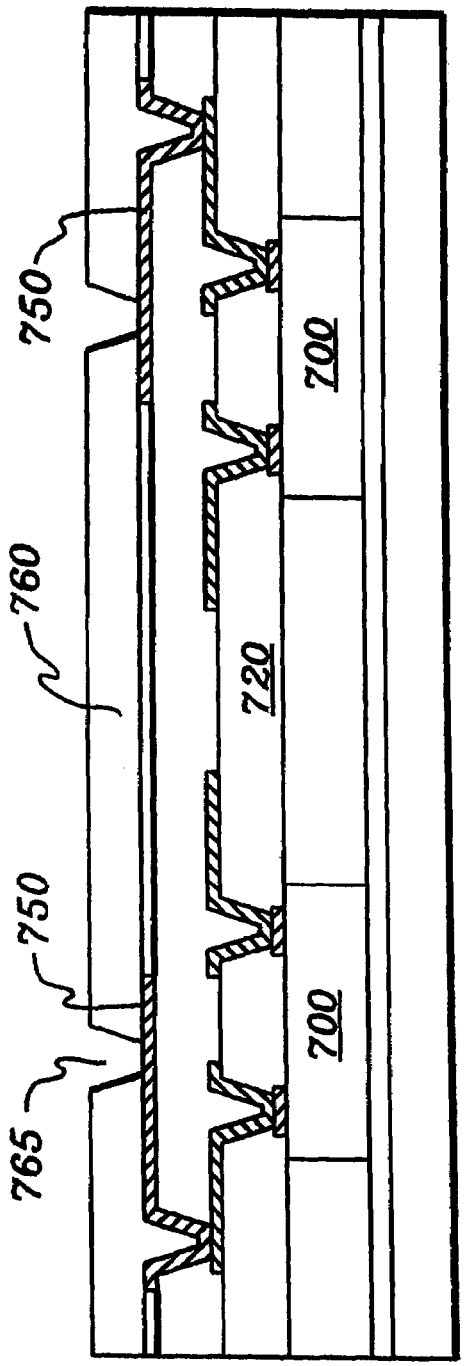
FIG. 8C is a cross-sectional elevational view of the structure of FIG. 8B showing deposition of a positive resist and patterning thereof to expose selected portions of the second metal layer in accordance with the principles of the present invention.
Figure 8D:
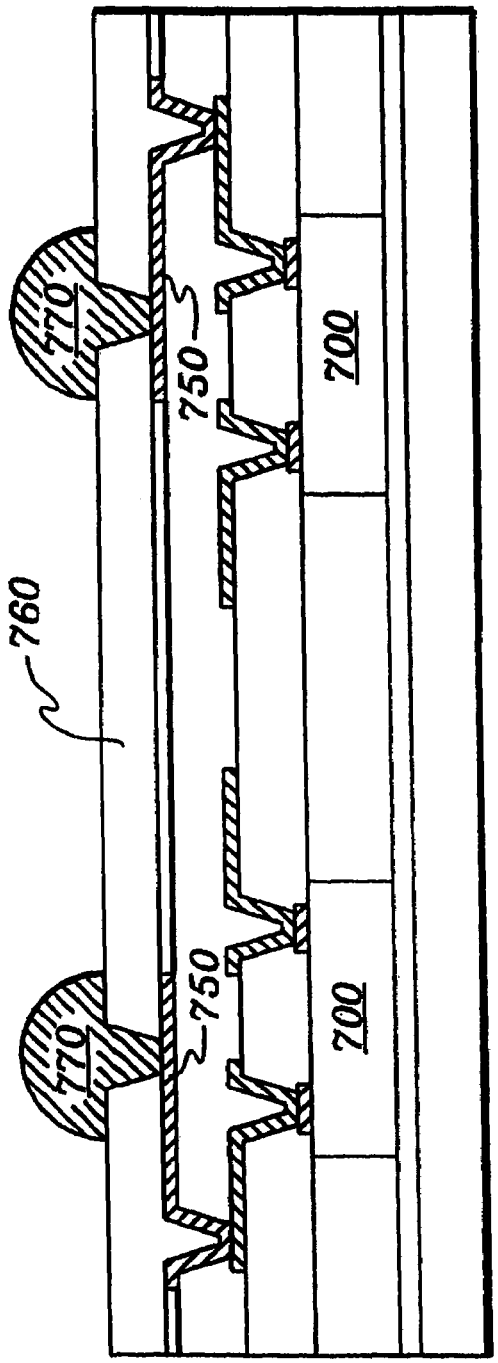
FIG. 8D is a cross-sectional elevational view of the structure of FIG. 8C after plating of conductive bumps in accordance with the principles of the present invention.
Figure 12D:
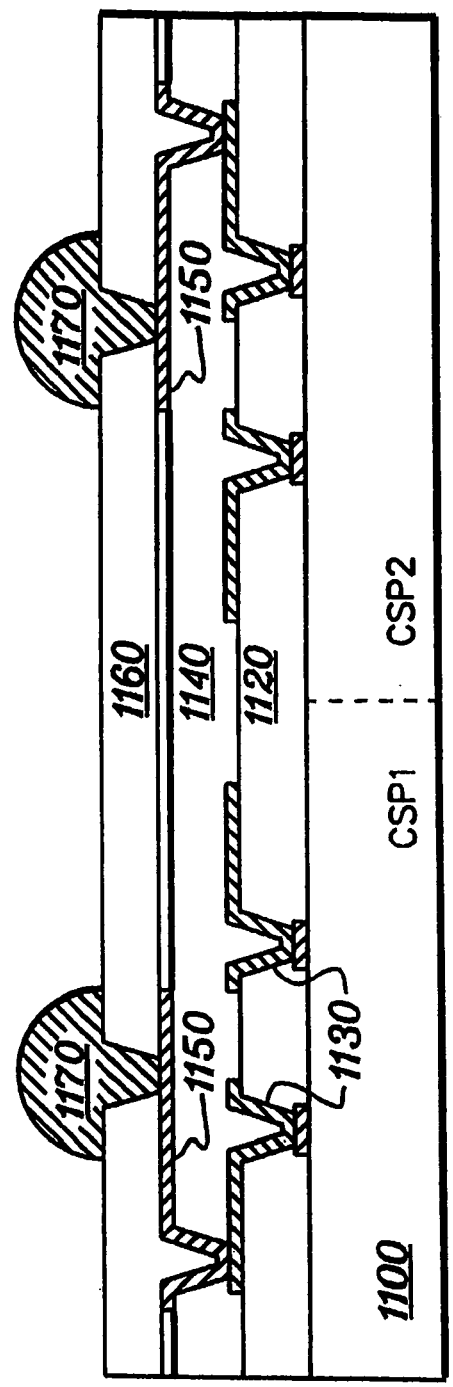
FIG. 12D is a cross-sectional elevational view of the structure of FIG. 12C after conductive bumps have been grown in accordance with the principles of the present invention.

Next, the electro deposited resist is hardened to increase its resistance to subsequent exposure to solvents by flood exposure to 4 Joules per square cm of UV at 365 nM. This is followed by spray application of a positive resist, e.g., type AZP 4620 available from Clariant Corporation, Sunnyvale, Calif. This resist is patterned to form small holes in the center of the metal 2 contact circles. Everything else is covered with resist. The holes may be 75 microns in diameter. FIGS. 8C and 12C show the positive resist with patterned holes. Bumps are formed by electroplating until, e.g., a bump of 100 microns height is formed. As the bump plates it grows both up and out once the copper is above the resist. This forms a mushroom-shaped bump 770, 1170 as depicted in FIGS. 8D and 12D. This mushroom shape is advantageous because of the combination of sections which make up the bump. The base of the bump is a large circle of copper which gives good adhesion to the top surface of the polymer. The top portion of the bump is the appropriate diameter for soldering to a circuit board. The metal stem between the base of the bump and the top portion of the bump is relatively small in diameter and thereby adds flexibility to the bump structure. This allows the bump to be displaced in lateral dimension and angle without placing undue stress on the structure or the resultant solder joint formed between the bump and, e.g., a circuit board.

Figure 12E:
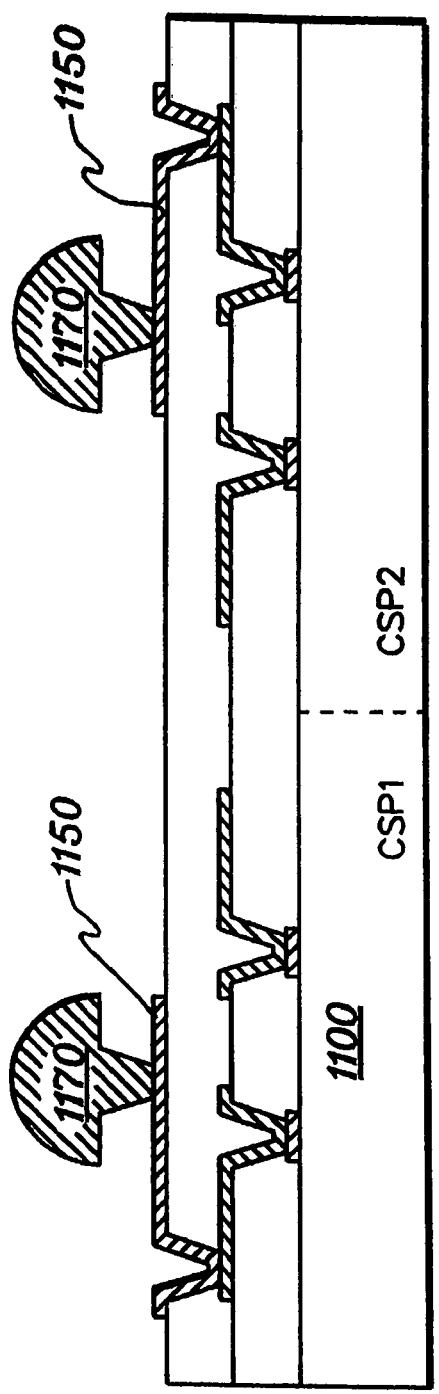
FIG. 12E is a cross-sectional elevational view of the structure of FIG. 12D after removal of the positive resist, electrodeposited resist and seed metal layers in accordance with the principles of the present invention.

The positive resist is stripped in a 1 part to 2 part solution of Propylene glycol methyl ether in Propanol. A 3:00 minute soak with continuous agitation has been found to be satisfactory. This is followed by stripping of the electro deposited resist in a 25%/75% $CF_4/O_2$ plasma and etching of the seed copper layer in Ammonium Persulfate. FIGS. 8E & 12E show the solid copper bump structures 770, 1170 with the positive and electro deposited resist removed, as well as the seed copper outside the metal 2 layers.

A self-patterning solder mask layer is next formed by spraying the compliant polymer layer to a thickness of 40 microns, soft baking the structure at 95 C for 30 minutes and UV flooding at 4 Joules/cm$^2$. A bake of 1 hour at 150 C follows. This layer tends to flow off the top of the bumps, fills in the via holes and partially covers the conductor layer. To be sure that the polymer is off the metal on top of the bumps a plasma etch in $CF_4/O_2$ at 400W in an LFE barrel etcher for 20 minutes can be conducted. Note that the solder mask completely surrounds the base of each bump providing the solder masking feature as well as providing distribution and leveling of stresses on the bumps. The process is completely self-aligning to the bumps and does not require a photo masking step.

Figure 12F:
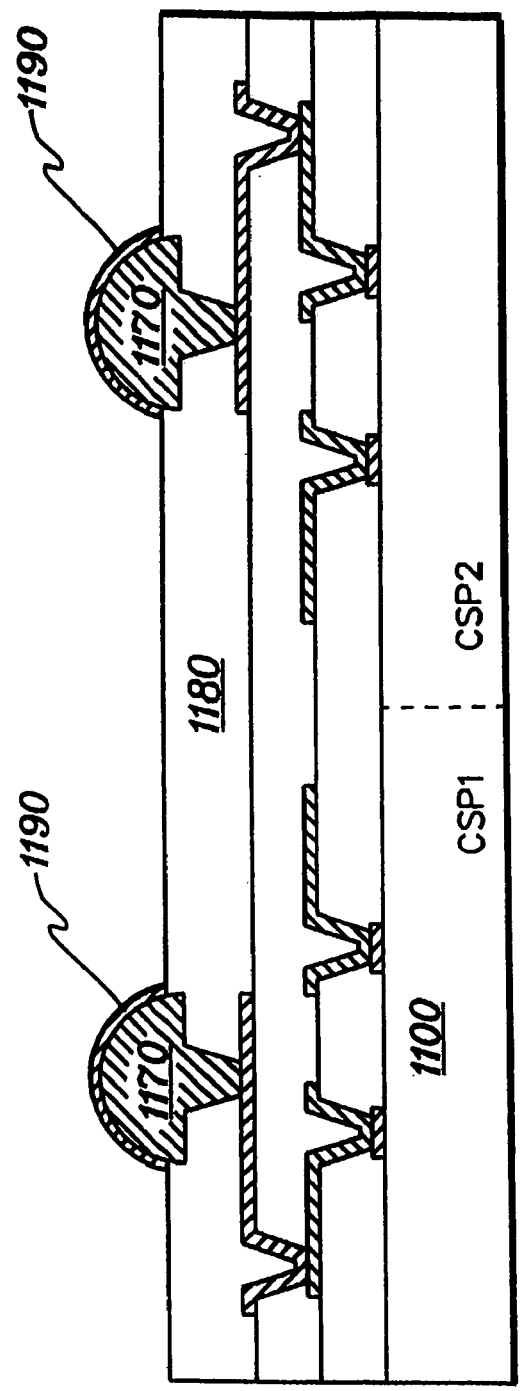
FIG. 12F is a cross-sectional elevational view of the structure of FIG. 12E after application of a self-patterning soldering mask and formation of a solderable finish on exposed portions of the conductive bumps.

To enhance and preserve solderability, an electroless layer of nickel followed by immersion gold can be applied to the exposed copper of the bumps. The copper is first etched in ammonium persulfate to remove oxide and then, e.g., the Ronamax nickel gold finishing process available from Lea Ronal of Freeport, N.Y. can be applied. FIGS. 8F & 12F show the completed panels with solder masks 780, 1180 and selectively applied solderable nickel/gold finishes 790, 1190.

Figure 9:
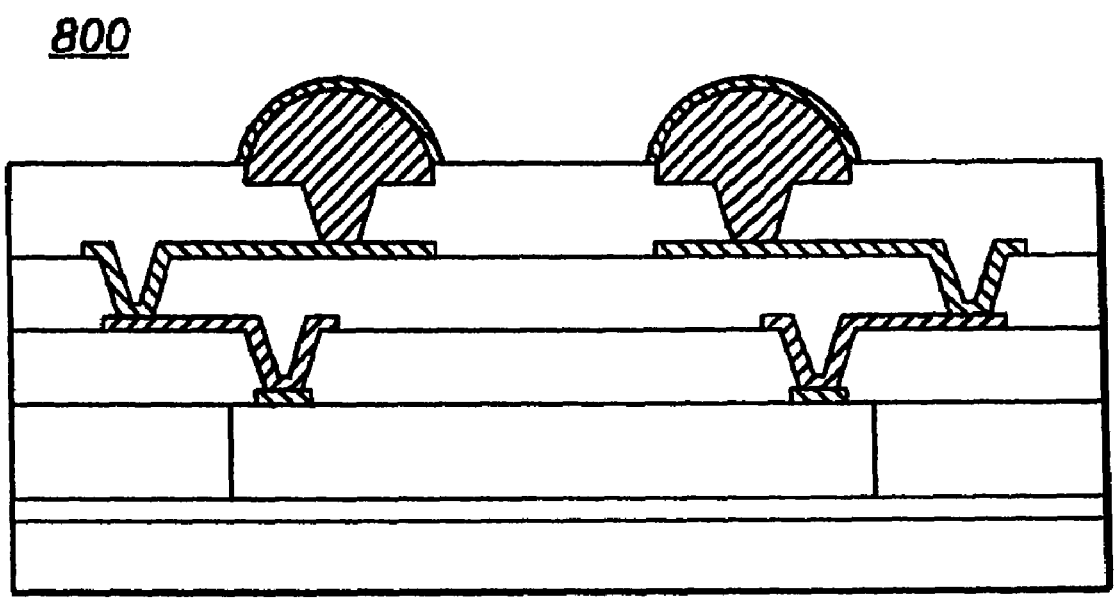
FIG. 9 is a cross-sectional elevational view of a singulated multilayer chip scale package (CSP) module obtained, for example, from the process structure of FIG. 8F in accordance with the principles of the present invention.
Figure 13:
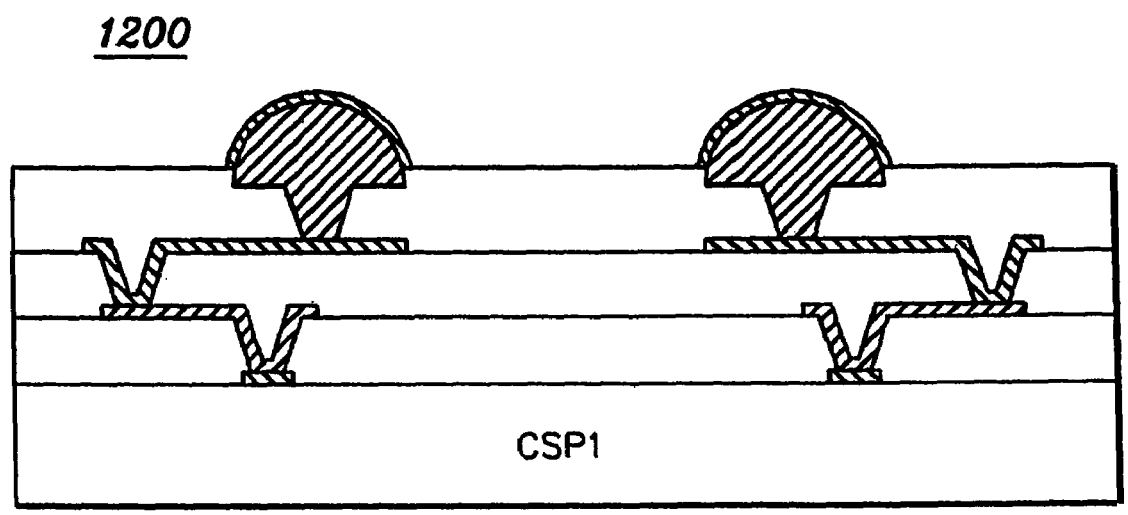
FIG. 13 is a cross-sectional elevational view of one embodiment of a singulated chip scale package (CSP) module obtained, for example, by singulating the structure of FIG. 12F in accordance with the principles of the present invention.

A CSP module is completed by sawing the panel or wafer into single modules. As noted above, the operation of dicing a panel or wafer is well known in the art. For example, singulation can be done using a Disco 320 available from Disco Corporation of Tokyo, Japan. FIG. 9 shows a multilayer chip scale package (CSP) 800 sawn from a panel. Alternatively, the multichip module of FIG. 8F could comprise the resultant structure. FIG. 13 shows a completed multilayer singulated chip scale package (CSP) 1200 module sawn from a wafer.

It is important to note some of the benefits and advantages of the structures described hereinabove. This discussion will center on the structures shown in FIGS. 9 & 8F but it is generally applicable to all the structures disclosed. The multichip module of FIG. 8F is distinguished from a Tessera structure in that the Tessera structure can not provide a multichip module, because it is fabricated on individual chips rather than on a panel of chips. In addition, the Tessera structure has no provision for via holes through its compliant layer. Contact is made to the bond pads at the edge of the chip by wire or ribbon bonding. This eliminates this area for interconnect wiring or for placement of bumps. Note that both interconnect and the I/O bumps are placed above the IC bond pads in the subject invention because via holes can be provided anywhere in the photo patternable compliant layer.

In the above description, the bump size provided (100 micron thick, 200 micron in diameter) is appropriate for mounting on a conventional printed circuit board. This is the bump size associated with a typical flip chip. Even smaller bumps can be provided however. Also note that the wiring goes directly to the IC chips and the wiring can comprise very fine lines. This shows that the subject invention has the advantages of flip chip technology, but the compliant bumps remove one of the greatest disadvantages of a flip chip, which is fatigue failure of the small bumps when attached to a non-thermal expansion matched circuit board such as an FR4 type board.

Figure 14C:
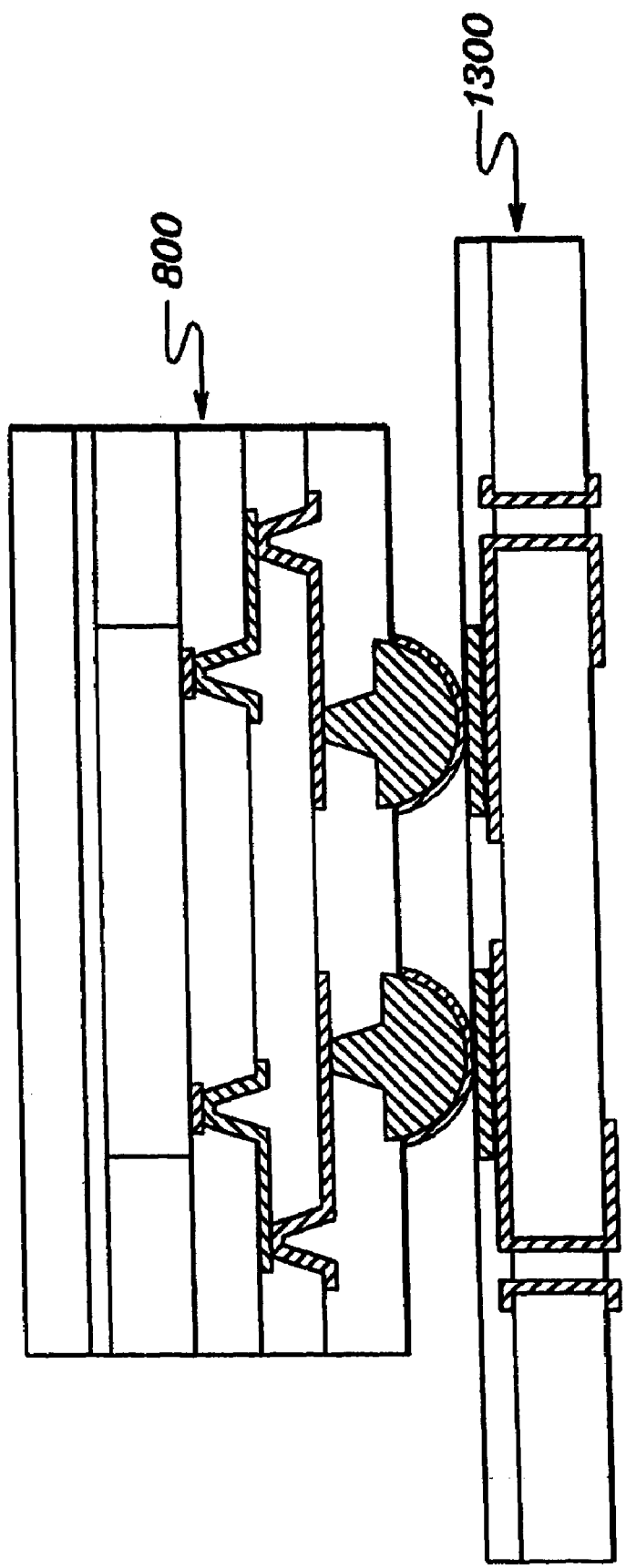
FIG. 14C is a cross-sectional elevational view of the structure of FIG. 14A and the CSP module of FIG. 9 electrically connected thereto in accordance with the principles of the present invention.
Figure 14D:
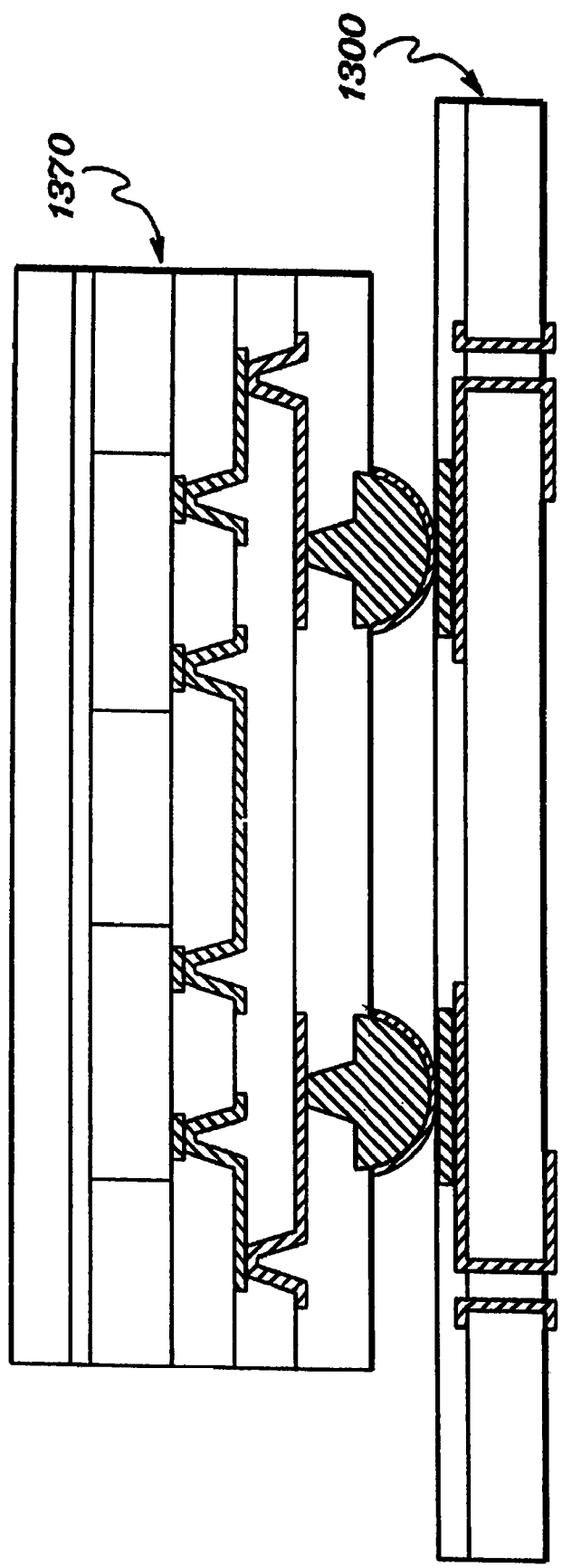
FIG. 14D is a cross-sectional elevational view of the structure of FIG. 14A showing a multichip module similar to that depicted in FIG. 8F electrically connected thereto in accordance with the principles of the present invention.
Figure 14E:
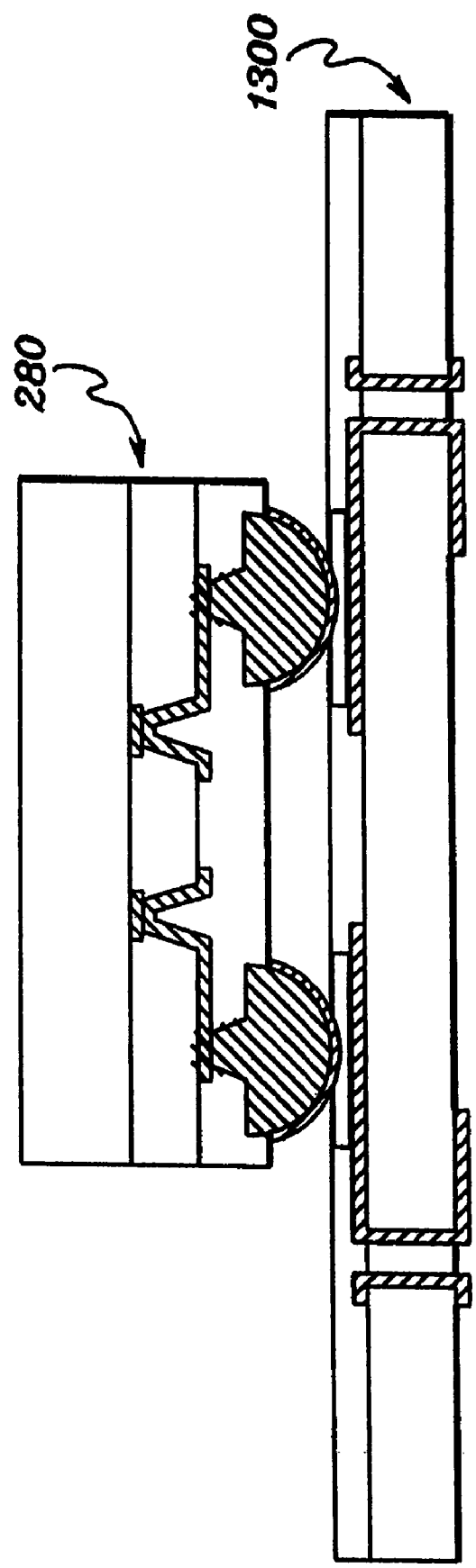
FIG. 14E is a cross-sectional elevational view of the structure of FIG. 14A and the CSP module of FIG. 3G electrically interconnected thereto in accordance with the principles of the present invention.

FIG. 14A shows a two sided printed circuit board 1300 with solder mask 1340 and stenciled solder paste 1345. Board 1300 includes through holes 1320 metallized with a desired conductive pattern 1330 and through holes 1325 with patterned solder mask 1340. Fabrication of this type of circuit board is well known in the art. This invention specifically relates to the provision of a bump with sufficient compliance to reduce the strain encountered when a CSP or MCM is soldered to a circuit board made of a non-expansion matched material such as an FR4 type board. FIG. 14B shows a multilayer compliant bump module 1000 (from FIG. 11) soldered to the printed circuit board 1300. FIG. 14D shows a multilayer solid bump module 800 (from FIG. 9) with compliant dielectric soldered to the printed circuit board 1300. FIG. 14E shows a single layer chip scale package (CSP) 280 sawn from a wafer and soldered to the printed circuit board 1300. Note in all cases shown, the CSP or MCM is mounted to the pads of a printed circuit board using a relatively thin layer of solder. It can be seen that if the circuit board and the module are not expansion matched there will be a resultant strain on portions of the module. In the subject invention, the strain is taken up primarily by the compliant bumps and/or the compliant dielectric layers between or beneath the bumps. This is due to the fact that the bumps and the dielectric layers have a modulus which is preferably orders of magnitude less than the modulus of the solder. The compliant dielectric has a large elongation capability, e.g., greater than 50%, which allows it to take up strains without fatigue much better than solder which fatigues after a few hundred cycles or less if the strain exceeds approximately 1%. The structures depicted in FIGS. 14B–14E are unique in that heretofore flip chip on board modules have had to be very small to limit displacement or needed underfill to try to limit the expansion of the circuit board under the chip. An assembly as shown in FIG. 14B has been tested to determine the efficacy of the structure. An array of 250 bumps on 0.5 mm centers was prepared and interconnected in a daisy chain with conductors on the test chip and a printed circuit board. Five such test chips were interconnected to the board. The board was then subjected to 1000 thermal cycles from 0 C to 100 C. No failures occurred. A typical flip chip of the same size would have failed before 100 cycles.

On another board a test chip was heated and removed. Flux was applied to the pads of the circuit board and another test chip placed and reflowed. Connection was obtained with no refurbishing of the solder on the pads of the circuit board.

Another capability of the modules fabricated as described above is that they can be temporarily connected into a circuit without the use of a socket. FIG. 15 shows a module connected to a circuit board without the use of solder. In the preferred approach the circuit board has a gold plating to reduce oxide and improve electrical connection. The compliance of the bump and/or dielectric allows any mismatch in the heights of the circuit board pads or module bumps to be absorbed. The pressure 1400 can be applied by the same spring assembly used to hold ball grid arrays in sockets. The ability to connect a module on a temporary basis without the use of solder allows for easy testing and for elimination of a costly socket. This is especially beneficial in the case of very high pin count devices with tight pad pitch. In general, sockets are several times more expensive than the package itself.

Figure 16:
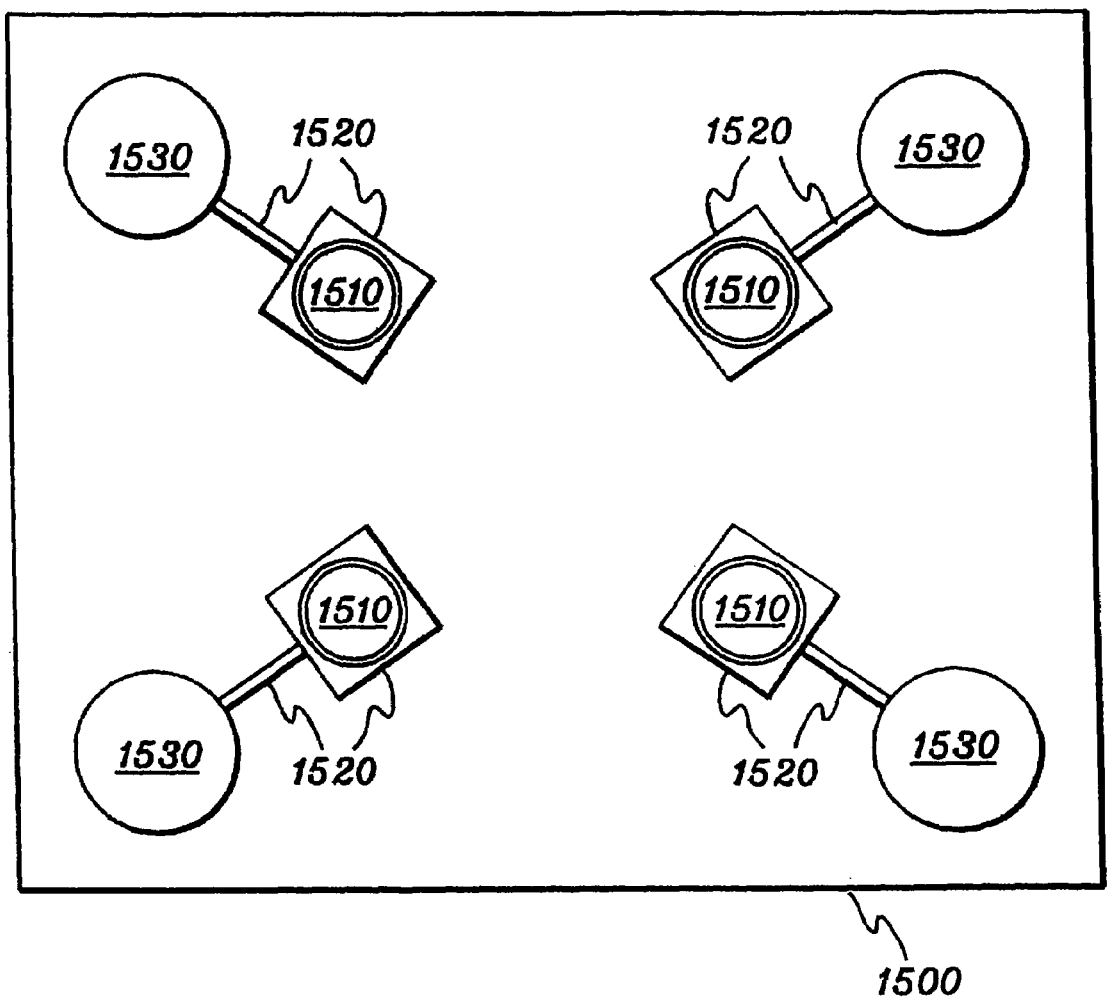
FIG. 16 depicts a planar view of bump interconnect disposition on an upper surface of a CSP or MCM module in accordance with the principles of the present invention.

In the solid metal bump structures disclosed herein, some stress is communicated to the solder on the circuit pads due to the requirement to stretch the interconnect to accommodate the thermal mismatch. To reduce this effect as much as possible, a novel structure is disclosed in FIG. 16. In this structure, the direction of the run 1520 from metallized vias 1510 which connects to the bump landing pad 1530 is always away from the center of the module. When the part is soldered in place the circuit board to which it is soldered is at its maximum expansion. As the board cools it contracts. Since the module does not contract as much, there is a net motion of the bumps which are attached to the circuit board toward the center of the module. This places the runs 1520 under compressive forces. This tends to slightly bend the run rather than actually compressing it. The bending requires less force than either stretching or compression. Since normal operating temperatures never reach solder temperature the run acts like a small spring taking up the expansion differentials by slightly bending.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for temporarily holding at least one integrated circuit chip during packaging thereof, said method comprising:
   (i) providing a support plate with a release film secured to a main surface thereof, said support plate and release film allowing UV light to pass therethrough;
   (ii) providing a UV curable chip adhesive disposed over said release film;
   (iii) placing said at least one integrated circuit chip in said UV curable chip adhesive; and
   (iv) shining UV light through said support plate and release film to cure said UV curable chip adhesive, thereby holding said at least one integrated circuit chip where placed.

2. The method of claim 1, wherein said at least one integrated circuit chip comprises a plurality of integrated circuit chips, and wherein said placing (iii) comprises placing said plurality of integrated circuit chips face down in said UV curable chip adhesive.

3. The method of claim 2, further comprising applying a structural material surrounding and physically contacting at least one side surface of each chip of said plurality of chips to mechanically interconnect in spaced, planar relationship said plurality of chips.

4. The method of claim 3, further comprising removing said support plate, release film and UV curable chip adhesive after said structural filler material has been applied to mechanically interconnect in spaced, planar relation said plurality of chips.

5. The method of claim 4, wherein said release film comprises a release adhesive, and wherein said removing comprises removing said support plate along said release adhesive, and thereafter removing said release film and any remaining UV curable chip attach adhesive.

6. The method of claim 5, wherein said release adhesive comprises a UV release adhesive, and wherein said removing comprises shining UV light through said support plate to activate said UV release adhesive to release said support plate.

7. The method of claim 6, wherein said removing of said remaining UV curable chip attach adhesive comprises using acetone and plasma cleaning to remove remaining UV curable chip attach adhesive.

8. The method of claim 1, wherein said release film comprises a UV release adhesive, and wherein said UV curable chip adhesive and said UV release adhesive have a differential response to UV light.

9. The method of claim 8, wherein said differential response comprises at least one of responses to UV light of different wavelength or responses to UV light of different energy, and wherein said shining (iv) comprises shining UV light of a wavelength or energy level needed to cure said UV curable chip adhesive, but not release said UV release adhesive.

10. The method of claim 9, wherein said differential response comprises responses to UV light of different energy and wherein said shining (iv) comprises shining UV light of a lower energy sufficient to cure said UV curable chip adhesive but not release said UV release adhesive.

11. The method of claim 8, wherein said support plate comprises a glass plate and said release film comprises a polyester film with said UV release adhesive disposed thereon.

12. The method of claim 1, wherein said providing (i) comprises securing said release film to said main surface of said support plate using roll lamination, wherein said release film includes a release adhesive.

13. The method of claim 1, further comprising applying a structural material surrounding and physically contacting at least one side surface of each chip of said plurality of chips to mechanically interconnect in spaced, planar relationship said plurality of chips, and attaching a process carrier to a planar main surface defined by lapping said structural material and said at least one integrated circuit chip, said attaching employing a permanent process adhesive.

14. A method for temporarily holding an object, said method comprising:

(i) providing a support plate with a release film secured to a surface thereof, said support plate and release film allowing UV light to pass therethrough;
(ii) providing an adhesive composition disposed over said release film, said adhesive composition comprising (a) from about 100 to 150 parts by weight of a UV transparent oligomer; (b) from about 110 to 330 parts by weight of an inert solvent; (c) from about 5 to 20 parts by weight of a photoinitiator; and (d) sufficient wetting agent to wet the substrate without interfering with the surface adhesion of the composition;
(iii) placing said object in contact with said adhesive;
(iv) shining UV light of a first wavelength and energy level through said support plate and release film to cure said adhesive, thereby holding said object where placed;
(v) carrying out additional process steps; and
(vi) shining UV light of a second wavelength and energy level through said support plate and release film to degrade said adhesive and allow separation of said object from said release film and said plate.

15. A method according to claim 14, wherein said inert solvent is chosen from esters, ethers and ether-esters.

16. A method according to claim 14, wherein said first and second wavelengths of UV light are the same and the energy levels are different.

17. A method according to claim 14, wherein said first and second wavelengths of UV light are different.

18. A method according to claim 14, comprising:
(i) providing a support plate with a release film secured to a surface thereof, said support plate and release film allowing UV light to pass therethrough;
(ii) providing an adhesive disposed over said release film, said adhesive comprising (a) about 120 parts by weight of a urethane acrylate oligomer; (b) about 225 parts by weight of propylene glycol monomethyl ether acetate; (c) about 10 parts by weight of a photoinitiator; and (d) about 0.03 parts by weight of a wetting agent;
(iii) placing said object in contact with said adhesive;
(iv) shining UV light of 365 to 480 nm and 75 to 200 $M/cm^2$ through said support plate and release film to cure said adhesive, thereby holding said object where placed;
(v) carrying out additional process steps; and
(vi) shining UV light of 365 nm and 3 Joules/$cm^2$ or greater through said support plate and release film to degrade said adhesive and allow separation of said object from said release film and said plate.

* * * * *

UNITED STATES PATENT AND TRADEMARK OFFICE
CERTIFICATE OF CORRECTION

PATENT NO. : 7,112,467 B2 Page 1 of 1
APPLICATION NO. : 10/989238
DATED : September 26, 2006
INVENTOR(S) : Charles W. Eichelberger and Paul V. Starenas It is certified that error appears in the above-identified patent and that said Letters Patent is hereby corrected as shown below:

Title page:

(75), The address of Inventor Paul V. Starenas :

Delete "Windham, NH (US)" and insert --Clearwater, Florida--

Signed and Sealed this

Sixth Day of February, 2007

JON W. DUDAS
*Director of the United States Patent and Trademark Office*